US011658206B2

(12) United States Patent
Lin et al.

(10) Patent No.: US 11,658,206 B2
(45) Date of Patent: May 23, 2023

(54) DEEP TRENCH STRUCTURE FOR A CAPACITIVE DEVICE

(71) Applicant: Taiwan Semiconductor Manufacturing Company, Ltd., Hsinchu (TW)

(72) Inventors: En-Shuo Lin, Hsinchu (TW); Sheng Ko, Hsinchu (TW); Chi-Fu Lin, Zhubei (TW); Che-Yi Lin, Hsinchu (TW); Clark Lee, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 162 days.

(21) Appl. No.: 16/949,769

(22) Filed: Nov. 13, 2020

(65) Prior Publication Data

US 2022/0157929 A1     May 19, 2022

(51) Int. Cl.
  *H01L 49/02*   (2006.01)
  *H01L 23/64*   (2006.01)
  *H01G 4/005*   (2006.01)
  *H01G 4/35*    (2006.01)

(52) U.S. Cl.
  CPC ............ *H01L 28/65* (2013.01); *H01G 4/005* (2013.01); *H01G 4/35* (2013.01); *H01L 23/642* (2013.01)

(58) Field of Classification Search
  CPC ....... H01L 28/65; H01L 23/642; H01L 28/40; H01G 4/005; H01G 4/35; B81B 7/02
  USPC ........................................................ 257/532
  See application file for complete search history.

(56) References Cited

U.S. PATENT DOCUMENTS

| 6,274,426 B1* | 8/2001 | Lee .................... H01L 27/10855 257/E21.507 |
| 2013/0095652 A1* | 4/2013 | Harada ............. H01L 21/76811 438/622 |
| 2020/0075498 A1* | 3/2020 | Kume ............... H01L 21/76831 |

* cited by examiner

*Primary Examiner* — Duy T Nguyen
(74) *Attorney, Agent, or Firm* — Harrity & Harrity, LLP

(57) ABSTRACT

A deep trench structure may be formed between electrodes of a capacitive device. The deep trench structure may be formed to a depth, a width, and/or an aspect ratio that increases the volume of the deep trench structure relative to a trench structure formed using a metal etch-stop layer. Thus, the deep trench structure is capable of being filled with a greater amount of dielectric material, which increases the capacitance value of the capacitive device. Moreover, the parasitic capacitance of the capacitive device may be decreased by omitting the metal etch-stop layer. Accordingly, the deep trench structure (and the omission of the metal etch-stop layer) may increase the sensitivity of the capacitive device, may increase the humidity-sensing performance of the capacitive device, and/or may increase the performance of devices and/or integrated circuits in which the capacitive device is included.

20 Claims, 18 Drawing Sheets

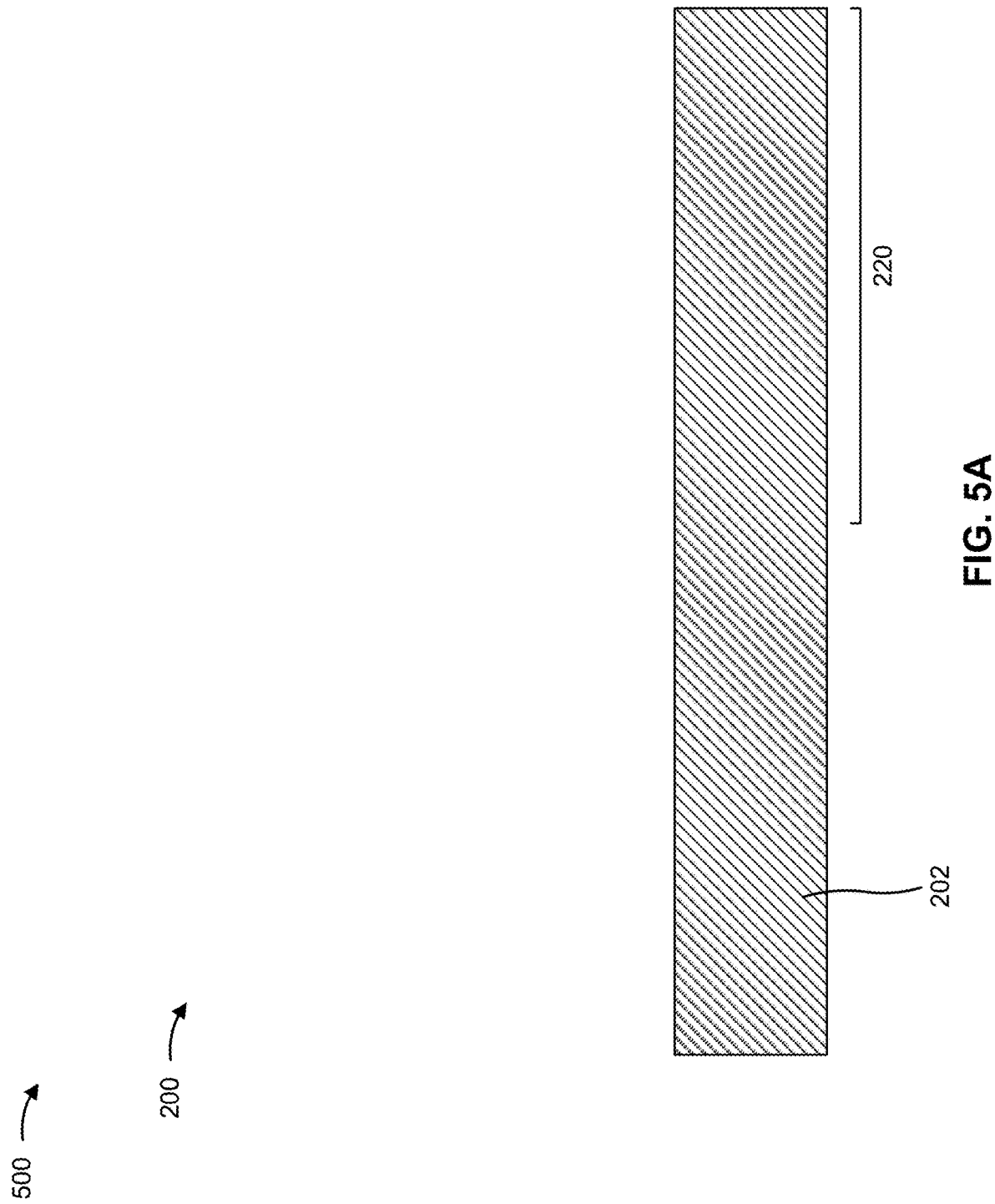

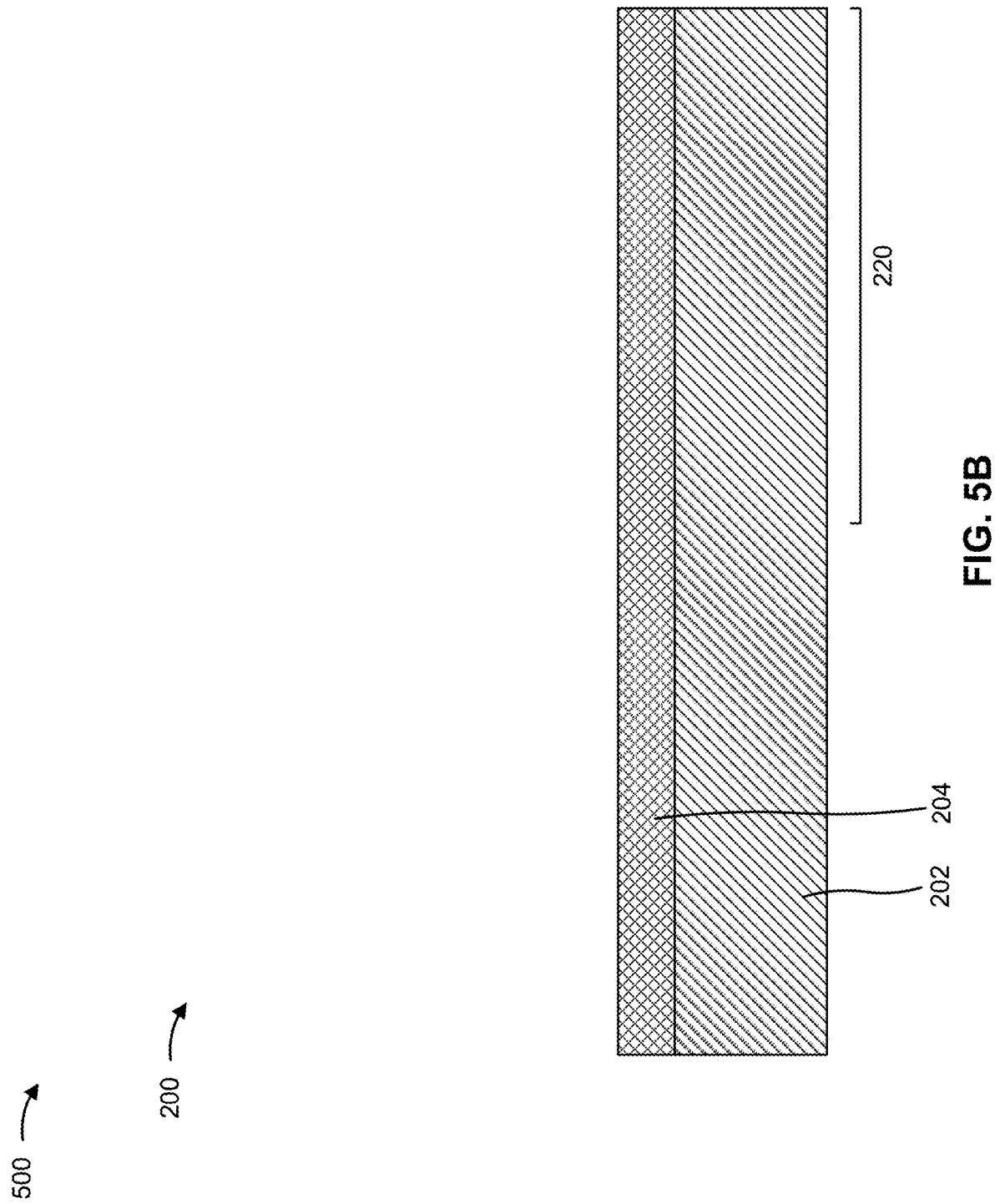

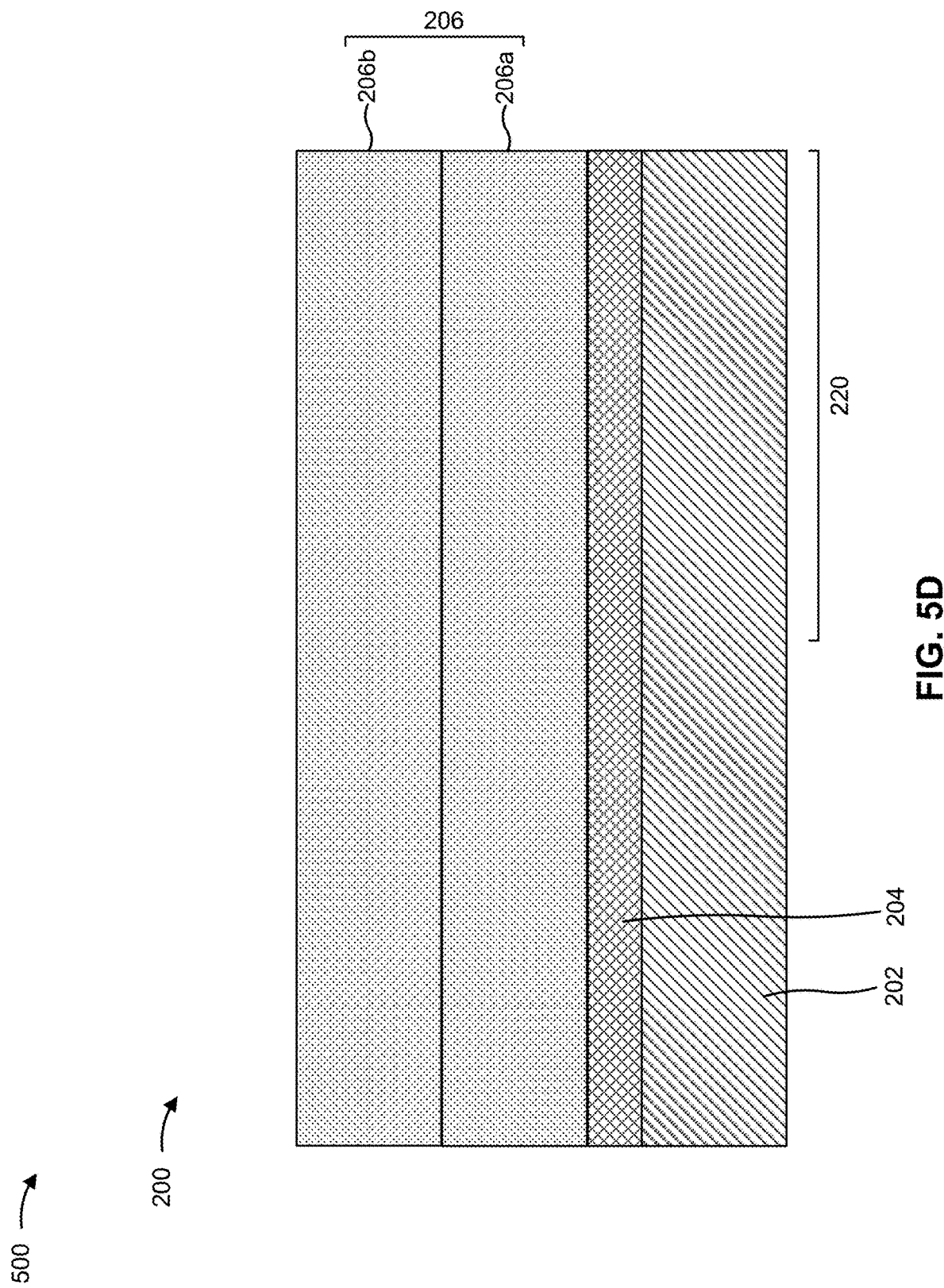

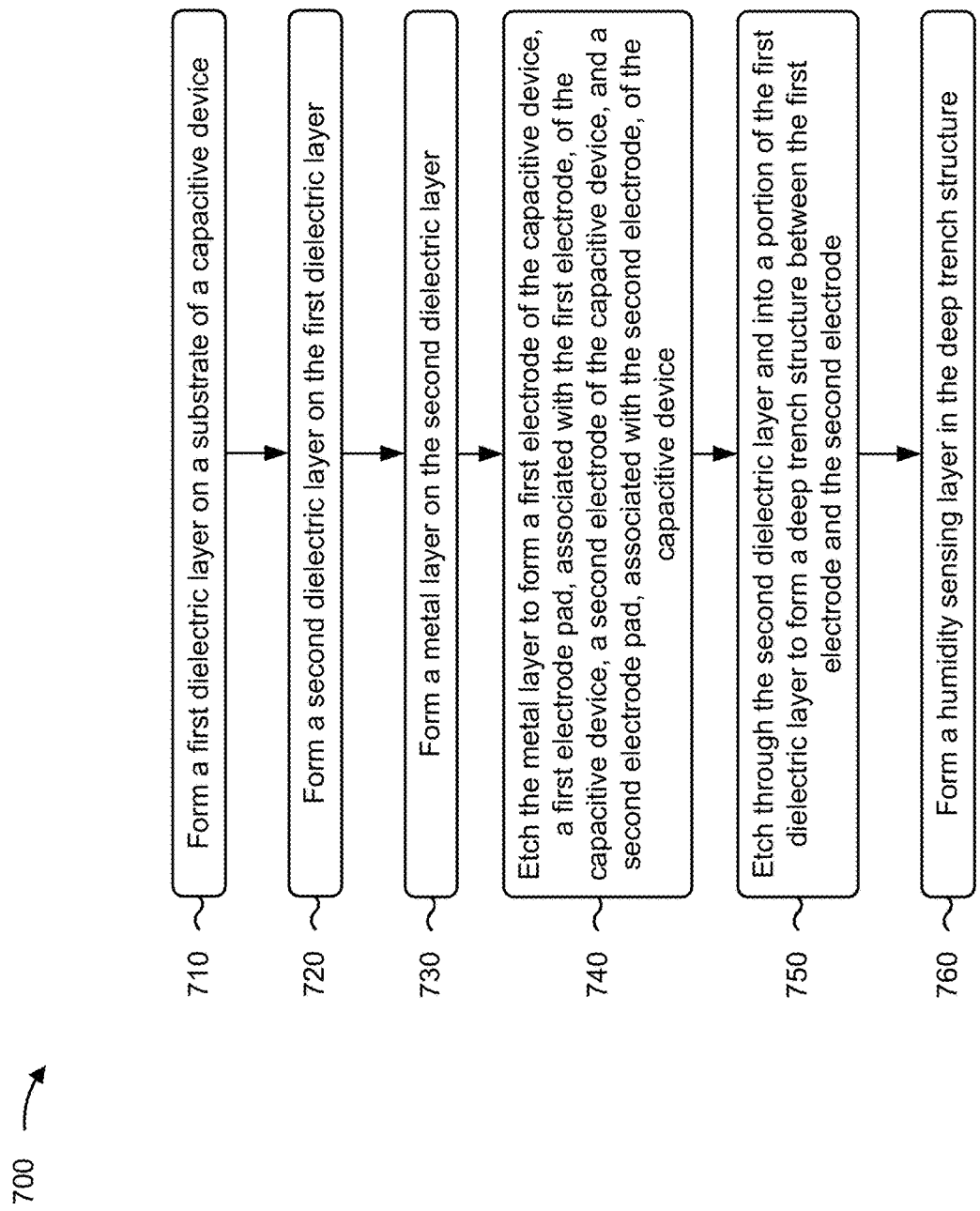

DEEP TRENCH STRUCTURE FOR A CAPACITIVE DEVICE

BACKGROUND

Integrated circuits may be fabricated on a semiconductor wafer. Semiconductor wafers can be stacked or bonded on top of each other to form what is referred to as a three-dimensional integrated circuit. Some semiconductor wafers include micro-electromechanical-system (MEMS) devices, which involves the process of forming micro-structures with dimensions in the micrometer scale (one millionth of a meter). Typically, MEMS devices are built on silicon wafers and realized in thin films of materials. Examples of MEMS applications include motion sensors, accelerometers, gyroscopes, and humidity sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5K are diagrams of an example implementation described herein.

FIG. 7 is a flowchart of an example process relating to forming a capacitive device described herein.

DETAILED DESCRIPTION

Figure 1:
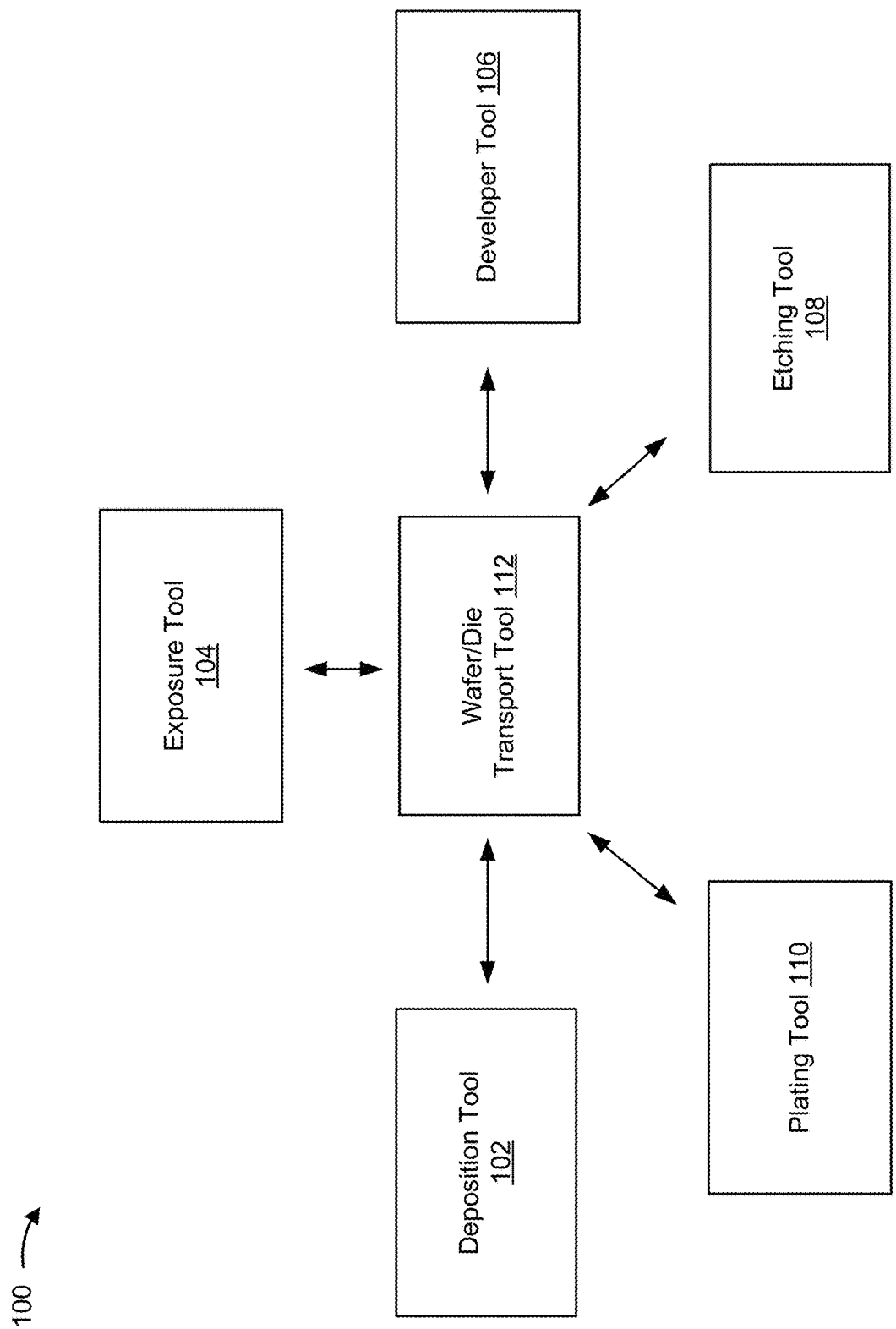
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A micro-electromechanical-system (MEMS) relative humidity sensor device is a MEMS device that may include one or more capacitive devices. A capacitive device may be a capacitor or may be a device that includes a plurality of capacitive elements electrically connected in parallel. A dielectric sensor may be placed between electrodes of a capacitor or a capacitive element. The dielectric sensor may be formed of a material having a dielectric constant that changes based on humidity. Changes in humidity cause a change in the dielectric constant of the dielectric sensor, which changes the capacitance of the capacitor or the capacitive element. The changes in capacitance can be converted to a measurement of relative humidity.

A dielectric sensor of a capacitor or a capacitive element may be formed in a trench between two structures on which the electrodes are formed. The trench may formed by etching through one or more layers down to a metal etch-stop layer. However, the use of the metal etch-stop layer may reduce the depth of the trench, which reduces the size of the dielectric sensor and decreases the capacitance of the capacitor or the capacitive element. This may reduce the humidity-sensing performance of the capacitor or the capacitive element. Moreover, parasitic capacitance resulting from the conductivity of the metal etch-stop layer may further reduce the humidity-sensing performance of the capacitor or the capacitive element.

Some implementations described herein provide a deep trench structure for a capacitive device. In some implementations, one or more metal etch-stop layers may be omitted from the capacitive device such that the deep trench structure may be formed between electrodes of the capacitive device down to (and partially in) an interlayer dielectric (ILD) layer of the capacitive device. In this way, the deep trench structure may be formed to a depth and/or an aspect ratio that increases the volume of the deep trench structure relative to a trench structure formed using a metal etch-stop layer. Thus, the deep trench structure is capable of being filled with a greater amount of dielectric material, which increases the capacitance value of the capacitive device. Moreover, the parasitic capacitance of the capacitive device may be decreased by omitting the metal etch-stop layer. Accordingly, the deep trench structure (and the omission of the metal etch-stop layer) may increase the sensitivity of the capacitive device, may increase the humidity-sensing performance of the capacitive device, and/or may increase the performance of devices (e.g., MEMS devices and/or other types of semiconductor devices) and/or integrated circuits in which the capacitive device is included.

FIG. 1 is a diagram of an example environment 100 in which systems and/or methods described herein may be implemented. As shown in FIG. 1, environment 100 may include a plurality of semiconductor processing tools 102-112. The plurality of semiconductor processing tools 102-112 may include a deposition tool 102, an exposure tool 104, a developer tool 106, an etching tool 108, a plating tool 110, a wafer/die transport tool 112, and/or another type of semiconductor processing tool. The plurality of semiconductor processing tools 102-112 included in example environment 100 may be included in a semiconductor clean room, a semiconductor foundry, a semiconductor processing and/or manufacturing facility, and/or the like.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light source, and/or the like), an x-ray source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etching tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of a the substrate using a plasma etch or a plasma-assisted etch, which may involve using an ionized gas to isotropically or directionally etch the one or more portions.

The plating tool 110 is a semiconductor processing tool that is capable of plating a substrate (e.g., a wafer, a semiconductor device, and/or the like) or a portion thereof with one or more metals. For example, the plating tool 110 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or the like.

Wafer/die transport tool 112 includes a mobile robot, a robot arm, a tram or rail car, an overhead hoist transfer (OHT) vehicle, and/or another type of device that are used to transport wafers and/or dies between semiconductor processing tools 102-110 and/or to and from other locations such as a wafer rack, a storage room, and/or the like. In some implementations, wafer/die transport tool 112 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

FIGS. 2, 3, 4A, and 4B are diagrams of an example capacitive device 200. Capacitive device 200 may be a capacitor or a device that includes a plurality of capacitive elements. In some implementations, capacitive device 200 may be included in another device or system, such as a MEMS device (e.g., a MEMS relative humidity sensor) or an integrated circuit, among other examples.

Figure 2:
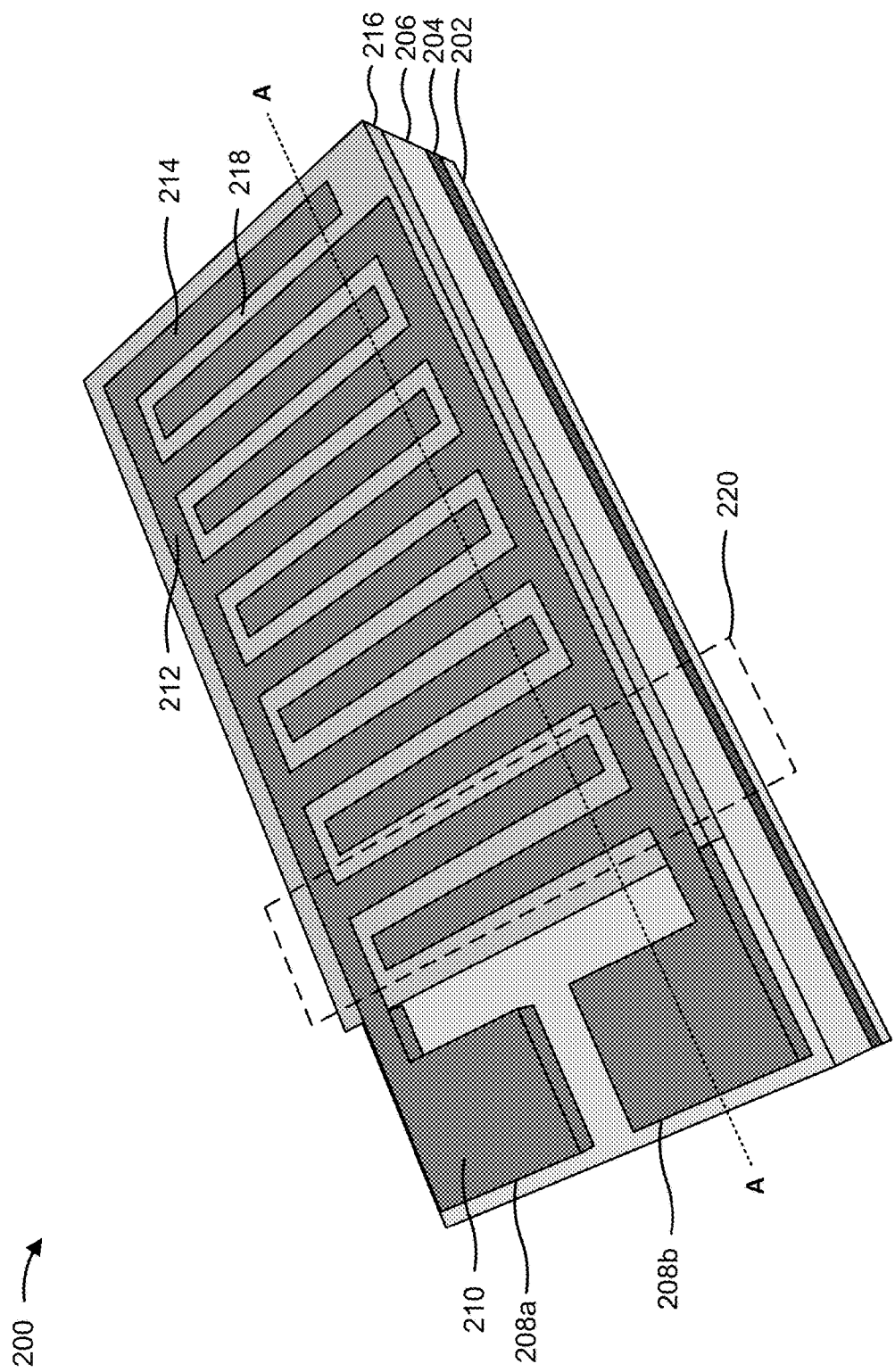
FIGS. 2, 3, 4A, and 4B are diagrams of an example capacitive device described herein.

FIG. 2 shows a perspective view of the example capacitive device 200. As shown in FIG. 2, the capacitive device 200 may include a substrate 202. The substrate 202 may include a semiconductor die substrate, a semiconductor wafer, or another type of substrate in which semiconductor devices may be formed. In some implementations, the substrate 202 is formed of silicon, a material including silicon, a III-V compound semiconductor material such as gallium arsenide (GaAs), a silicon on insulator (SOI), or another type of semiconductor material.

As further shown in FIG. 2, the capacitive device 200 may include a first dielectric layer 204 above and/or on the substrate 202. The dielectric layer 204 may be an interlayer dielectric (ILD) layer formed of an electrically insulating material that electrically insulates one or more structures or layers of the capacitive device 200 from other structures or layers of the capacitive device 200. For example, the dielectric layer 204 may include tantalum nitride (TaN), silicon oxide ($SiO_x$), silicate glass, silicon oxycarbide, a silicon nitride ($Si_xN_y$), and/or the like.

As further shown in FIG. 2, the capacitive device 200 may include a dielectric layer 206 above and/or on the dielectric layer 204. The dielectric layer 206 may be an intermetal dielectric (IMD) layer formed of an electrically insulating material that electrically insulates one or more structures or layers of the capacitive device 200 from one or more metallization layers or metal structures of the capacitive device 200. For example, the dielectric layer 206 may include tantalum nitride (TaN), silicon oxide ($SiO_x$), silicate glass, silicon oxycarbide, a silicon nitride ($Si_xN_y$), and/or the like.

As further shown in FIG. 2, the capacitive device 200 may include a plurality of electrode structures 208 (e.g., electrode structure 208a and electrode structure 208b). The electrode structures 208 may be formed above and/or on the dielectric layer 206. Each electrode structure 208 may be formed of a conductive metal capable of carrying an electric charge such as gold, aluminum, or silver, among other examples. An electrode structure 208 may be configured to store an electric charge. For example, the electrode structure 208a may be configured to store a positive charge (and thus, may be referred to as a positive charge electrode structure, a positive electrode structure, or a p-electrode structure), and the electrode structure 208b may be configured to store a negative charge (and thus, may be referred to as a negative charge electrode structure, a negative electrode structure, or an n-electrode structure).

Each electrode structure 208 may include an electrode pad 210 that electrically connects the electrode structure 208 to interconnects, vias, external contact pads, and/or other structures of the capacitive device 200 (or the device or system in which the capacitive device 200 is included). The electrode pad 210 may connect to a main structure 212, which may also be referred to as a trunk line, a backbone, and/or the like. A plurality of electrodes 214 may branch off of the main structure 212.

As further shown in FIG. 2. the main structure 212 and the electrodes 214 may form a comb structure in which the electrodes 214 are positioned or configured substantially perpendicular to the main structure 212. Moreover, the electrodes 214 of the electrode structure 208a and the electrodes 214 of the electrode structure 208b may be interdigitated. In these examples, the electrodes 214 of the electrode structure 208a may be positioned or configured in the spaces between the electrodes 214 of the electrode structure 208b, and the electrodes 214 of the electrode structure 208b may be positioned or configured in the spaces between the electrodes 214 of the electrode structure 208a.

As further shown in FIG. 2, the capacitive device 200 may include a dielectric layer 216 above and/or on the dielectric layer 206, and in between electrodes 214 of the electrode structures 208. The dielectric layer 216 may be formed of a dielectric material that is sensitive to humidity, such as a polyimide layer or another polymer that is electrically insulating and sensitive to atmospheric humidity. The dielectric layer 216 may be sensitive to humidity in that the dielectric constant of the dielectric layer 216 changes based on the humidity of the environment in which the capacitive device 200 is located.

The dielectric layer 216 may be located or positioned in a non-conductive region 218 between respective pairs of electrodes 214. Each pair of electrodes 214 may include an electrode 214 of the electrode structure 208a and an electrode 214 of the electrode structure 208b. Thus, each pair of electrodes 214 may include a positive electrode (or positive charge electrode or p-electrode) and a negative electrode (or negative charge electrode or n-electrode). Accordingly, when the capacitive device 200 is in operation, an electric field may be generated in the dielectric layer 216 in a non-conductive region 218 between a pair of electrodes 214 as a result of positive charge stored by a positive electrode and negative charge stored by a negative electrode of the pair of electrodes 214. A combination of a positive electrode, a negative electrode, and the dielectric layer 216 in a non-conductive region 218 between the positive electrode and the negative electrode may form a capacitive element 220 (or capacitor) of the capacitive device 200.

Figure 3:
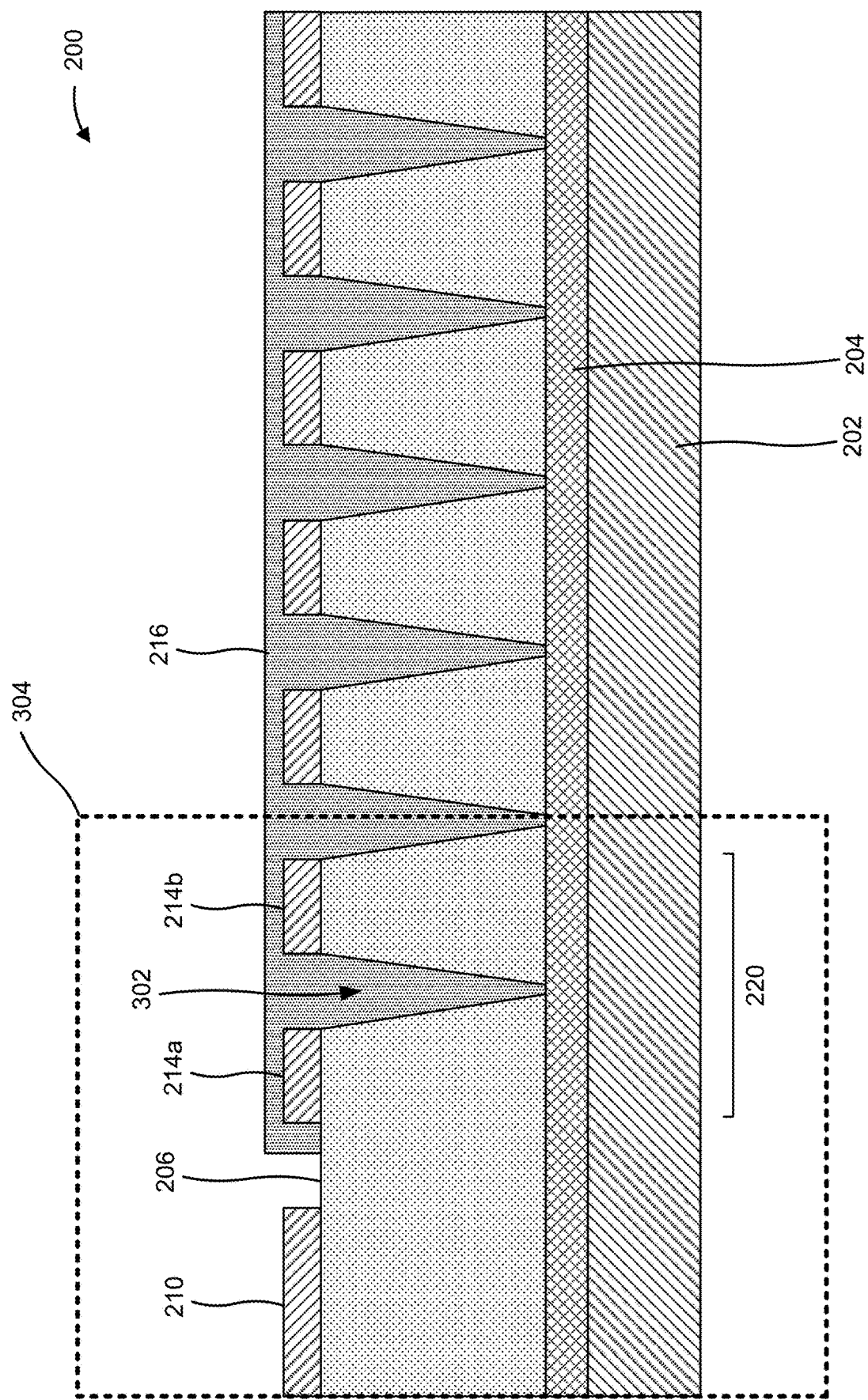

FIG. 3 shows a cross-sectional view of a portion of the capacitive device 200 along line AA of FIG. 2. As shown in FIG. 3, the dielectric layer 204 may be located above and/or on the substrate 202, the dielectric layer 206 may be located above and/or on the dielectric layer 204 without an intervening metallization layer between the dielectric layer 204 and the dielectric layer 206, and the electrode pads 210 and the electrodes 214 of the electrode structures 208 may be located above and/or on the dielectric layer 206.

As further shown in FIG. 3, deep trench structures 302 may be formed in the dielectric layer 206 between electrodes 214 such that the electrodes 214 are positioned on substantially trapezoidal shaped structures of the dielectric layer 206. In particular, a deep trench structure 302 may be located in a non-conductive region 218 between a pair of electrodes 214 configured to store opposing charge of a capacitive element 220. For example, a deep trench structure 302 may be located between an electrode 214a (e.g., configured to store a positive charge or a negative charge) and an electrode 214b (e.g., configured to store a type of charge that opposes the type of charge stored by electrode 214a so if electrode 214a stores a positive charge, electrode 214b stores a negative charge, or vice versa). The deep trench structures 302 of the capacitive device 200 may be filled with the dielectric layer 216. The dielectric layer 216 may also be formed above and/or on the electrodes 214 to protect the electrodes from corrosion and other environmental effects.

In situations where the capacitive device 200 is included in a relative humidity sensing device (e.g., a MEMS relative humidity sensor device or another type of relative humidity sensing device), the dielectric layer 206 in the deep trench structure 302 may function as a humidity sensing layer. In these situations, the dielectric constant of the humidity sensing layer may be based on and/or may change based on humidity in the environment in which the relative humidity sensing device is located. Changes in the dielectric constant of the humidity sensing layer may result in changes to the electric field (and thus, the capacitance) between the electrodes 214a and 214b. The relative humidity sensing device may include additional circuitry and/or components to measure the electric field and/or the capacitance between the electrodes 214a and 214b and/or convert the measurement to a relative humidity value.

Figure 4A:
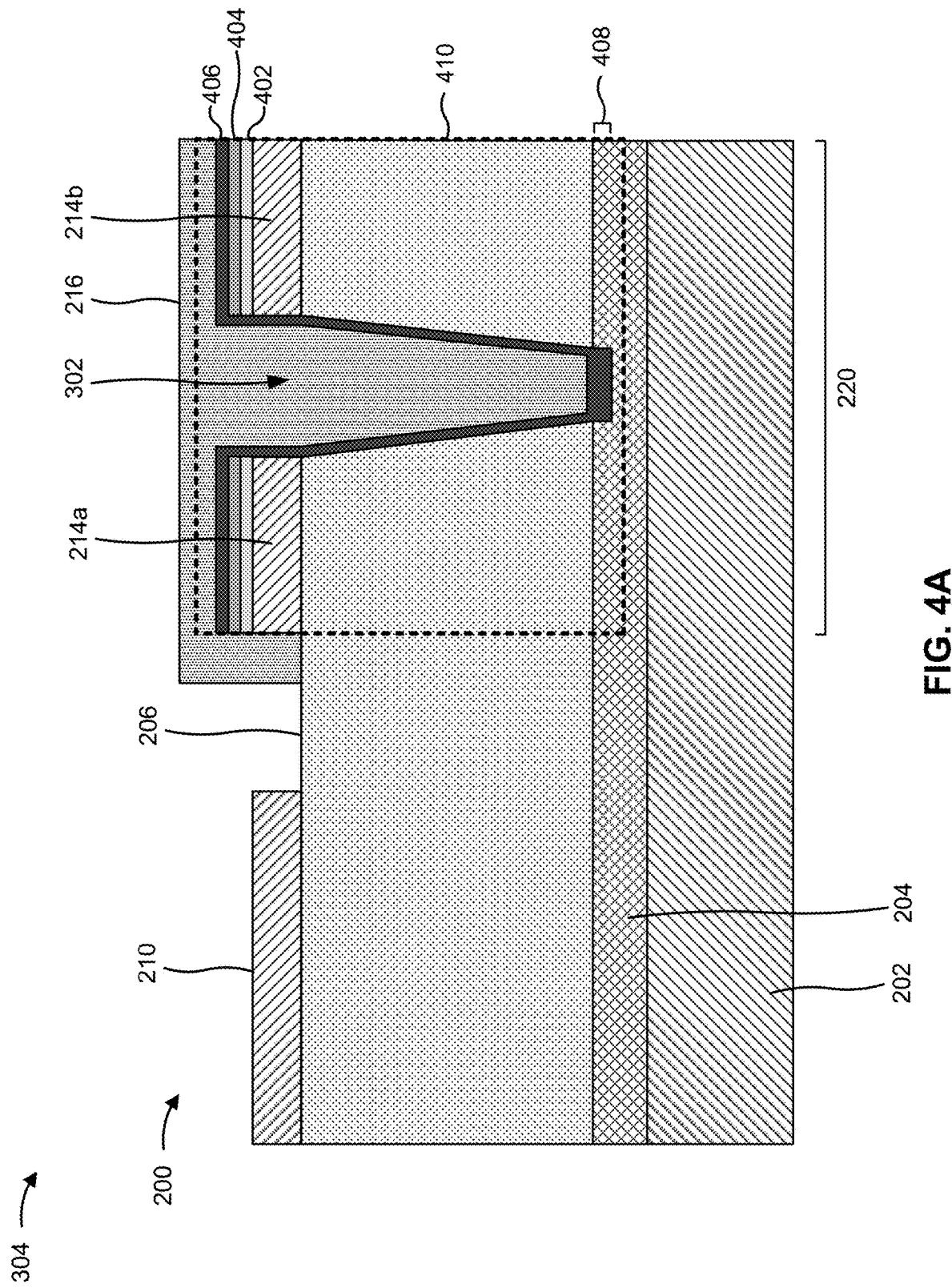

FIG. 4A shows a cross-sectional close-up view 304 from a portion of the capacitive device 200 shown in FIG. 3. As shown in FIG. 4A, the dielectric layer 204 may be located above and/or on the substrate 202, the dielectric layer 206 may be located above and/or on the dielectric layer 204 without an intervening metallization layer between the dielectric layer 204 and the dielectric layer 206, the electrode pads 210 and the electrodes 214a and 214b of the capacitive element 220 may be located above and/or on the dielectric layer 206, and the deep trench structure 302 may be located in and/or through the dielectric layer 206 between the electrodes 214a and 214b.

As further shown in FIG. 4A, the capacitive device 200 may include one or more passivation layers, such as a passivation layer 402, a passivation layer 404, and a passivation layer 406. The passivation layer 402 may be located above and/or on the electrodes 214a and 214b. The passivation layer 402 may include an oxide material, such as a silicon oxide ($SiO_x$), a metallized oxide, or another type of oxide material. The passivation layer 402 may provide outside circuit passivation and may electrically isolate the electrodes 214a and 214b from other electrodes 214 and other circuits and/or devices of the capacitive device 200.

The passivation layer 404 may be located above and/or on passivation layer 402 (e.g., which is above and/or on the electrodes 214a and 214b). The passivation layer 404 may include a nitride material, such as a silicon nitride ($Si_xN_y$) or another type of nitride material. The passivation layer 404 may provide outside circuit passivation and may electrically isolate the electrodes 214a and 214b from other electrodes 214 and other circuits and/or devices of the capacitive device 200.

The passivation layer 406 may be located above and/or on passivation layer 404 (e.g., which is above and/or on the electrodes 214a and 214b). Moreover, the passivation layer 406 may be located in the deep trench structure 302. In particular, the passivation layer 406 may be located on the bottom of the deep trench structure 302 and on the sidewalls of the deep trench structure 302. In this way, the passivation layer 406 in the deep trench structure 302 forms a trench liner that provides cavity passivation for the deep trench structure 302. In some implementations, the passivation layer 406 includes a nitride material such as a silicon nitride ($Si_xN_y$) or another type of nitride material. The dielectric layer 216 (e.g., the humidity sensing layer, in some implementations) may be located above and/or on the passivation layer 406 in the deep trench structure 302 and above the electrodes 214a and 214b.

As further shown in FIG. 4A, the deep trench structure 302 may be located in a portion of the dielectric layer 204 below a top surface of the dielectric layer 204 referred to as an over-etch region 408. The over-etch region 408 may be formed in the dielectric layer 204 during etching of the dielectric layer 206 when forming the deep trench structure 302 to achieve a particular trench depth of the deep trench structure 302, to achieve a particular trench width of the deep trench structure 302, and/or to achieve a particular aspect ratio for the deep trench structure 302. In these examples, the bottom of the deep trench structure 302 is located in the over-etch region 408, and therefore is located in a portion of the dielectric layer 204 below the top surface of the dielectric layer 204. The passivation layer 406 may be formed on the dielectric layer 204 in the over-etch region 408 at the bottom of the deep trench structure 302 and at least partially below the top surface of the dielectric layer 204.

Figure 4B:
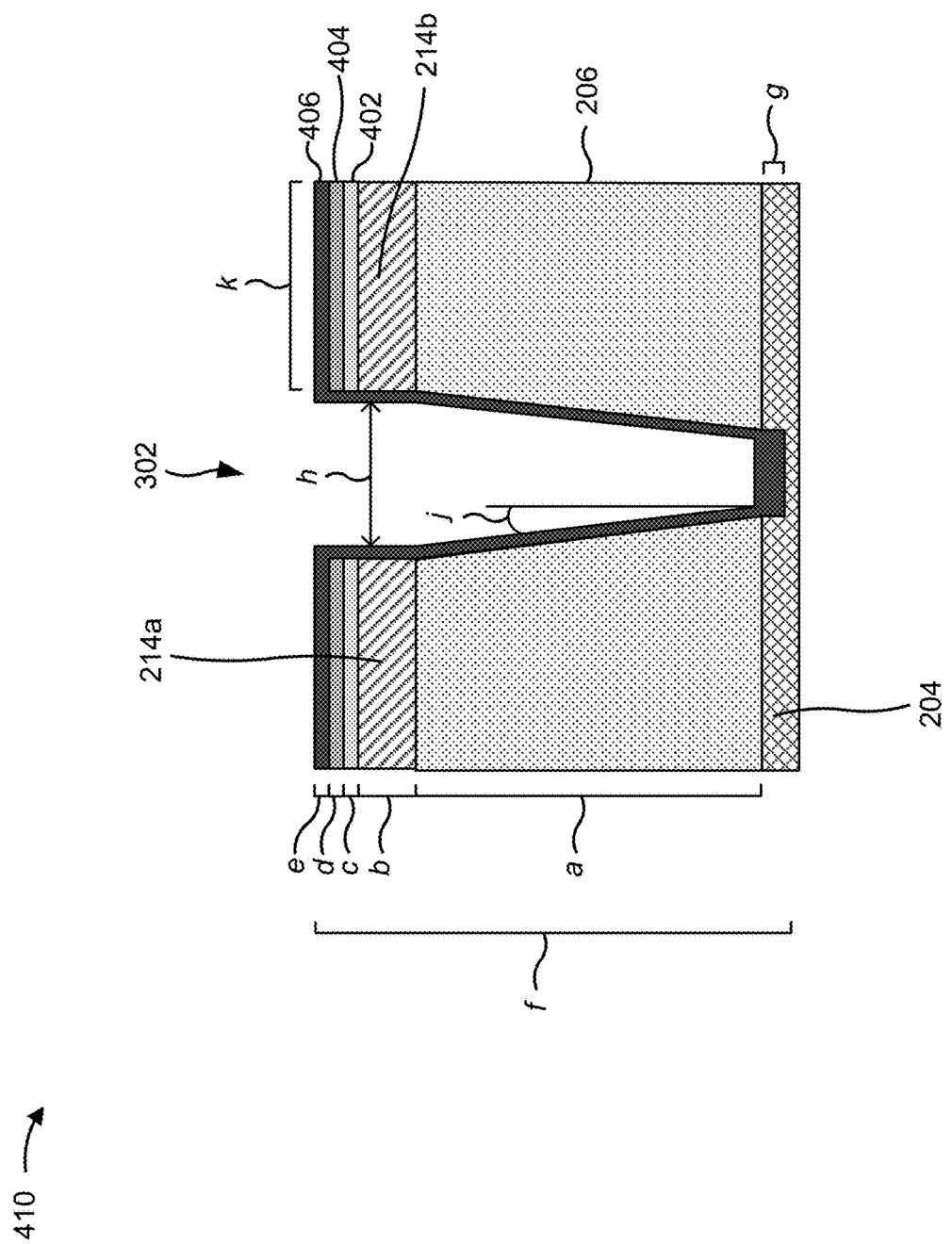

FIG. 4B shows a cross-sectional close-up view 410 from a portion of the capacitive device 200 shown in FIG. 4A. As shown in FIG. 4B, various layers and/or structures of the capacitive device 200 may be formed to particular dimensions or dimensional ranges. In particular, the dielectric layer 206 may be formed to a height (or thickness) a, the electrodes 214a and 214b may be formed to a height (or thickness) b, the passivation layer 402 may be formed to a height (or thickness) c, the passivation layer 404 may be formed to a height (or thickness) d, and/or the passivation layer 404 may be formed to a height (or thickness) e. The dielectric layer 206 may be formed to the height a such that a particular depth f of the deep trench structure 302 may be achieved, such that a particular aspect ratio of the deep trench structure 302 may be achieved, and/or such that the volume within the deep trench structure 302 may be achieved. As an example, the height a of the dielectric layer 206 may be approximately 24,000 angstroms.

The electrodes 214a and 214b may each be formed to the height b such that a particular charge-storage capacity of the electrodes 214a and 214b may be achieved, such that a particular capacitance value for the capacitive device 200 and/or the capacitive element 220 may be achieved, and/or such that a particular capacitance value range for the capacitive device 200 and/or the capacitive element 220 may be achieved. As an example, the height b of the electrodes 214a and 214b may be approximately 8,000 angstroms.

The passivation layer 402 may be formed to the height c such that the passivation layer 402 may provide a particular amount of circuit passivation, such that a particular depth f of the deep trench structure 302 may be achieved, such that a particular aspect ratio of the deep trench structure 302 may be achieved, and/or such that the volume within the deep trench structure 302 may be achieved. As an example, the height c of the passivation layer 402 may be approximately 2,000 angstroms.

The passivation layer 404 may be formed to the height d such that the passivation layer 404 may provide a particular amount of circuit passivation, such that a particular depth f of the deep trench structure 302 may be achieved, such that a particular aspect ratio of the deep trench structure 302 may be achieved, and/or such that the volume within the deep trench structure 302 may be achieved. As an example, the height d of the passivation layer may be approximately 3,000 angstroms.

The passivation layer 406 may be formed to the height e such that the passivation layer 406 may provide a particular amount of trench passivation, such that a particular depth f of the deep trench structure 302 may be achieved, such that a particular aspect ratio of the deep trench structure 302 may be achieved, and/or such that the volume within the deep trench structure 302 may be achieved. As an example, the height e of the passivation layer may be approximately 4,000 angstroms.

The over-etch region 408 may be formed to the depth g such that a particular depth f of the deep trench structure 302 may be achieved, such that a particular aspect ratio of the deep trench structure 302 may be achieved, and/or such that the volume within the deep trench structure 302 may be achieved. As an example, the depth [[f]] g of the over-etch region 408 may be in a range of approximately 1,000 angstroms to approximately 9,000 angstroms.

The deep trench structure 302 may be formed to the depth f the width h, the sidewall angle j, and/or to a particular aspect ratio between the width h and the depth f such that one or more operational parameters and/or performance parameters for the capacitive device 200 and/or the capacitive element 220 are achieved. As an example, the deep trench structure 302 may be formed to the depth f the width h, the sidewall angle j, and/or to a particular aspect ratio between the width h and the depth f such that a particular capacitive value or capacitive value range (e.g., approximately 15,920 picofarads, approximately 15,650 picofarads to approximately 16,060 picofarads, among other examples) for the capacitive device 200 and/or the capacitive element 220 is achieved. As another example, the deep trench structure 302 may be formed to the depth f the width h, the sidewall angle j, and/or to a particular aspect ratio between the width h and the depth f such that a threshold amount of parasitic capacitive for the capacitive device 200 and/or the capacitive element 220 is achieved. As another example, the deep trench structure 302 may be formed to the depth f the width h, the sidewall angle j, and/or to a particular aspect ratio between the width h and the depth f such that a particular amount of volume (e.g., an amount of volume in which the dielectric layer 216 may be deposited) in the deep trench structure 302 is achieved.

An example depth f of the deep trench structure 302 may be in a range of approximately 42,000 angstroms to approximately 50,000 angstroms to achieve and/or satisfy one or more of the operational parameters and/or performance parameters described above. An example aspect ratio of the deep trench structure 302, between the width h of the deep trench structure 302 and the depth f of the deep trench structure 302, may be in a range of approximately 0.26 to approximately 0.38 to achieve and/or satisfy one or more of the operational parameters and/or the performance parameters described above. In some implementations, an example width h of the deep trench structure 302 is in a range of approximately 13,000 angstroms to approximately 15,000 angstroms to achieve and/or satisfy one or more of the operational parameters and/or performance parameters described above. In some implementations, an example width h of the deep trench structure 302 is greater than approximately 15,000 angstroms to achieve and/or satisfy one or more of the operational parameters and/or performance parameters described above. An example sidewall angle j of the sidewalls of the deep trench structure 302 may be in a range of approximately 7 degrees to approximately 8 degrees to achieve and/or satisfy one or more of the operational parameters and/or performance parameters described above.

The electrodes 214a and 214b may each be formed to a width k such that a particular charge-storage capacity of the electrodes 214a and 214b may be achieved, such that a particular capacitance value for the capacitive device 200 and/or the capacitive element 220 may be achieved, and/or such that a particular capacitance value range for the capacitive device 200 and/or the capacitive element 220 may be achieved. As an example, the width k of the electrodes 214a and 214b may be approximately 11,000 angstroms.

As indicated above, FIGS. 2, 3, 4A, and 4B are provided as one or more examples. Other examples may differ from what is described with regard to FIGS. 2, 3, 4A, and 4B.

Figure 5C:
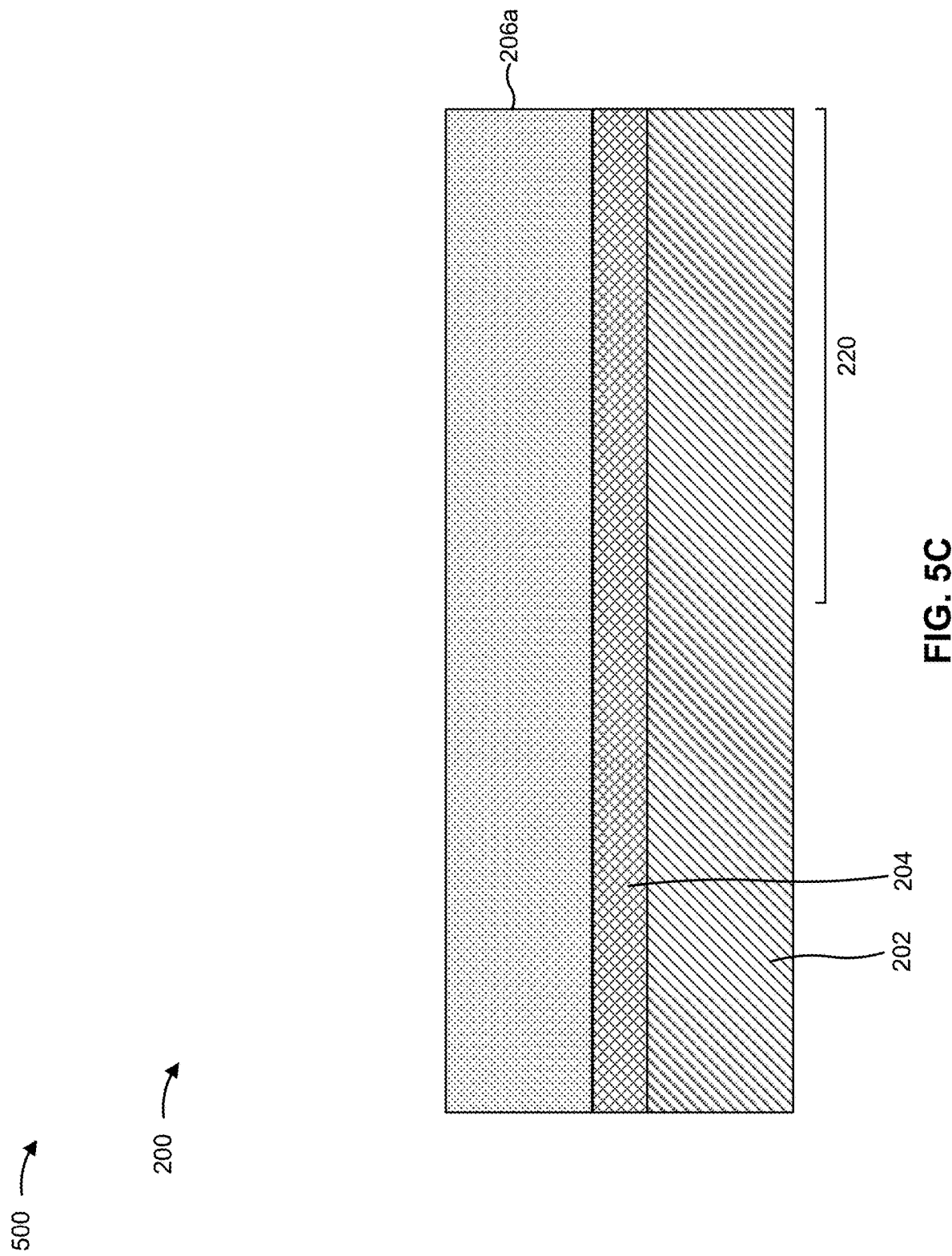

FIGS. 5A-5K are diagrams of an example implementation 500 described herein. In particular, example implementation 500 may be an example of forming the capacitive device 200 or a portion thereof. As shown in FIG. 5A, the portion of the capacitive device 200 may include a capacitive element 220. As further shown in FIG. 5A, the capacitive device 200 may include the substrate 202 on which other layers and/or structures of the capacitive device 200 may be formed.

As shown in FIG. 5B, the dielectric layer 204 (e.g., the ILD layer) may be formed above and/or on the substrate 202. A semiconductor processing tool (e.g., the deposition tool 102) may deposit the dielectric layer 204 using a CVD technique, a PVD technique, an ALD technique, or another type of deposition technique.

As shown in FIG. 5C, a first portion 206a of the dielectric layer 206 (e.g., the IMD layer) may be formed above and/or on the dielectric layer 204. A semiconductor processing tool (e.g., the deposition tool 102) may deposit the first portion 206a of the dielectric layer 206 using a CVD technique, a PVD technique, an ALD technique, or another type of deposition technique.

As shown in FIG. 5D, a second portion 206b of the dielectric layer 206 (e.g., the IMD layer) may be formed above and/or on the first portion 206a of the dielectric layer 206. A semiconductor processing tool (e.g., the deposition tool 102) may deposit the second portion 206b of the dielectric layer 206 using a CVD technique, a PVD technique, an ALD technique, or another type of deposition technique.

In some implementations, the dielectric layer 206 is composed of the first portion 206a and the second portion 206b, and the first portion 206a and the second portion 206b are formed in separate deposition operations. In some implementations, the height (or thickness) of the first portion 206a and the height (or thickness) of the second portion 206b are the same height (or thickness). In some implementations, the height (or thickness) of the first portion 206a and the height (or thickness) of the second portion 206b are different heights (or different thicknesses). In some implementations, the dielectric layer 206 is composed of a single dielectric layer that is formed in a single deposition operation. The dielectric layer 206 may be formed above and/or on the dielectric layer 204 without an intervening metallization layer between the dielectric layer 204 and the dielectric layer 206.

Figure 5E:
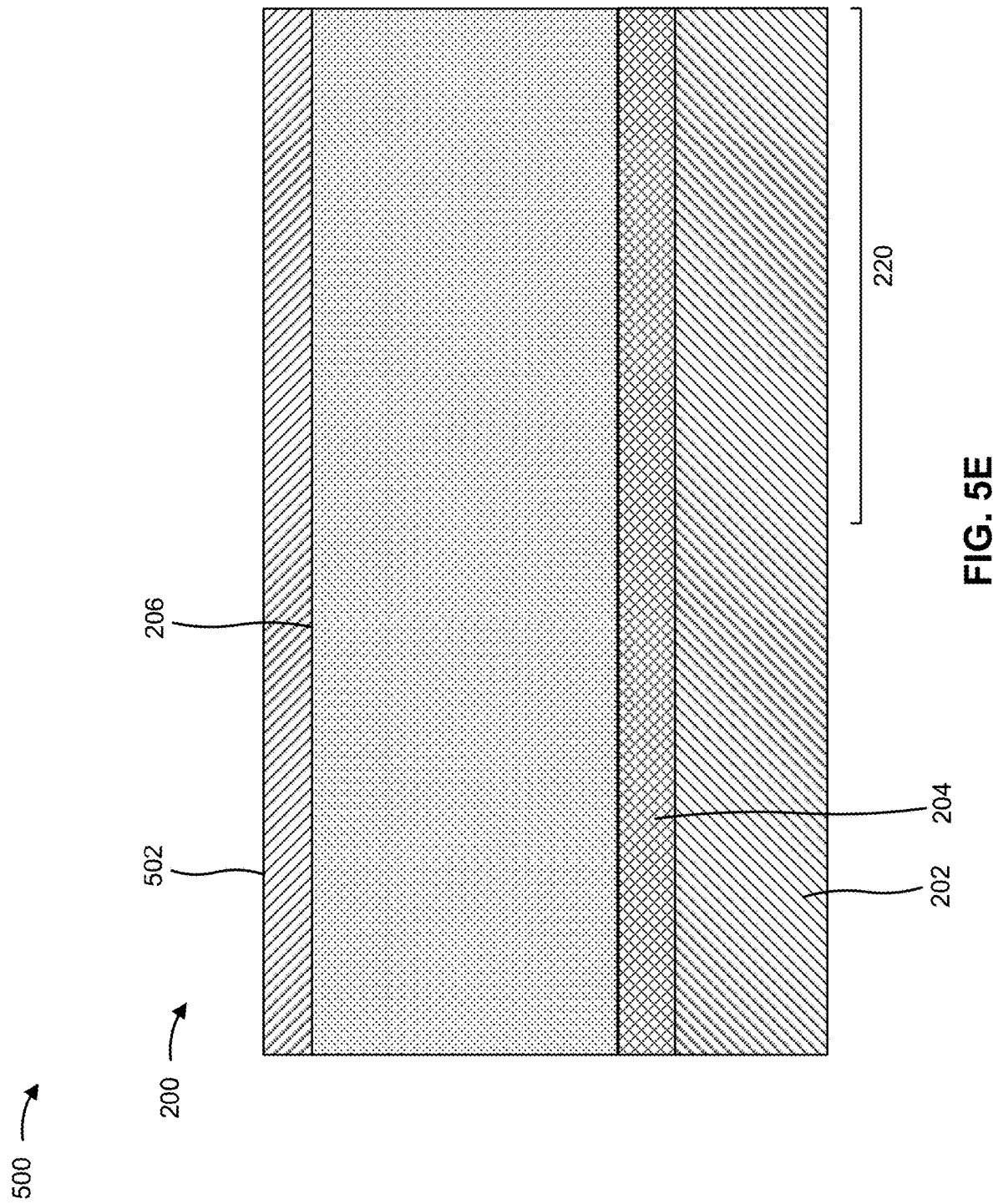

As shown in FIG. 5E, a metallization layer 502 may be formed above and/or on the dielectric layer 206. A semiconductor processing tool may form or deposit the metallization layer 502 above and/or on the dielectric layer 206. In some implementations, the deposition tool 102 deposits the metallization layer 502 using a CVD technique, a PVD technique, an ALD technique, or another type of deposition technique. In some implementations, the plating tool 110 deposits the metallization layer 502 using a plating technique such as electroplating (or electro-chemical deposition). In these examples, the plating tool 110 may apply a voltage across an anode formed of a plating material and a cathode (e.g., a substrate). The voltage causes a current to oxidize the anode, which causes the release of plating material ions from the anode. These plating material ions form a plating solution that travels through a plating bath toward the capacitive device 200. The plating solution reaches the capacitive device 200 and deposits plating material ions onto the dielectric layer 206 to form the metallization layer 502.

Figure 5F:
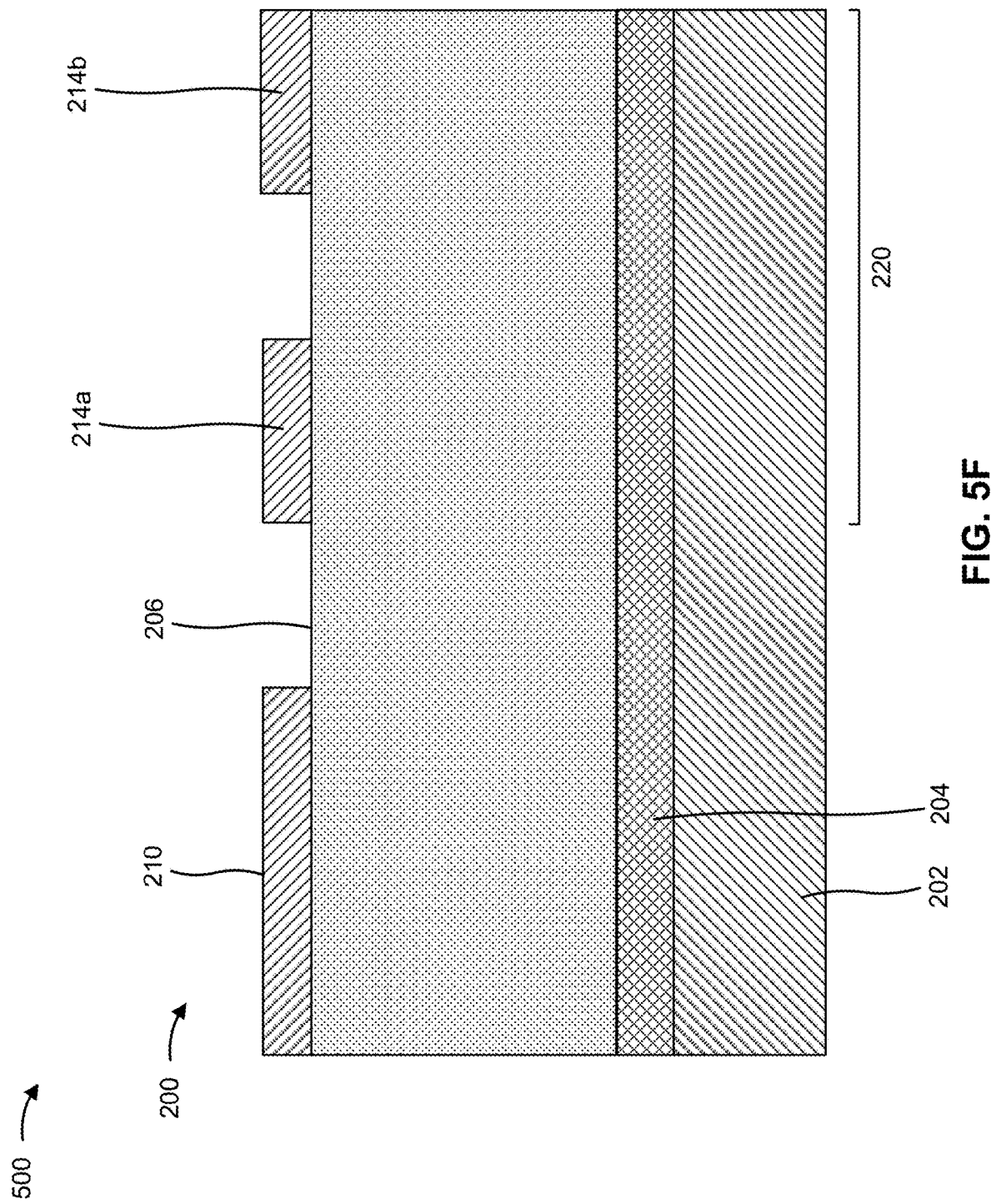

As shown in FIG. 5F, a plurality of portions of the metallization layer 502 may be etched through to the dielectric layer 206 to form the electrode pads 210 and the electrodes 214 of the electrode structures 208 included in the capacitive device 200. For example, an electrode pad 210 and one or more electrodes 214a may be formed for an electrode structure 208a, and another electrode pad 210 and one or more electrodes 214b may be formed for an electrode structure 208b. The electrode pads 210 and the electrodes 214 may be formed by coating the metallization layer 502 with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching the plurality of portions of the metallization layer 502 to the dielectric layer 206 based on the pattern in the photoresist. In some implementations, the metallization layer 502 may be formed to a height (or thickness) such that the electrodes 214a and 214b satisfy a capacitance value parameter for the capacitive device 200, and/or the metallization layer 502 may be etched so that a width of the electrodes 214a and 214b satisfy the capacitance value parameter for the capacitive device 200.

Figure 5G:
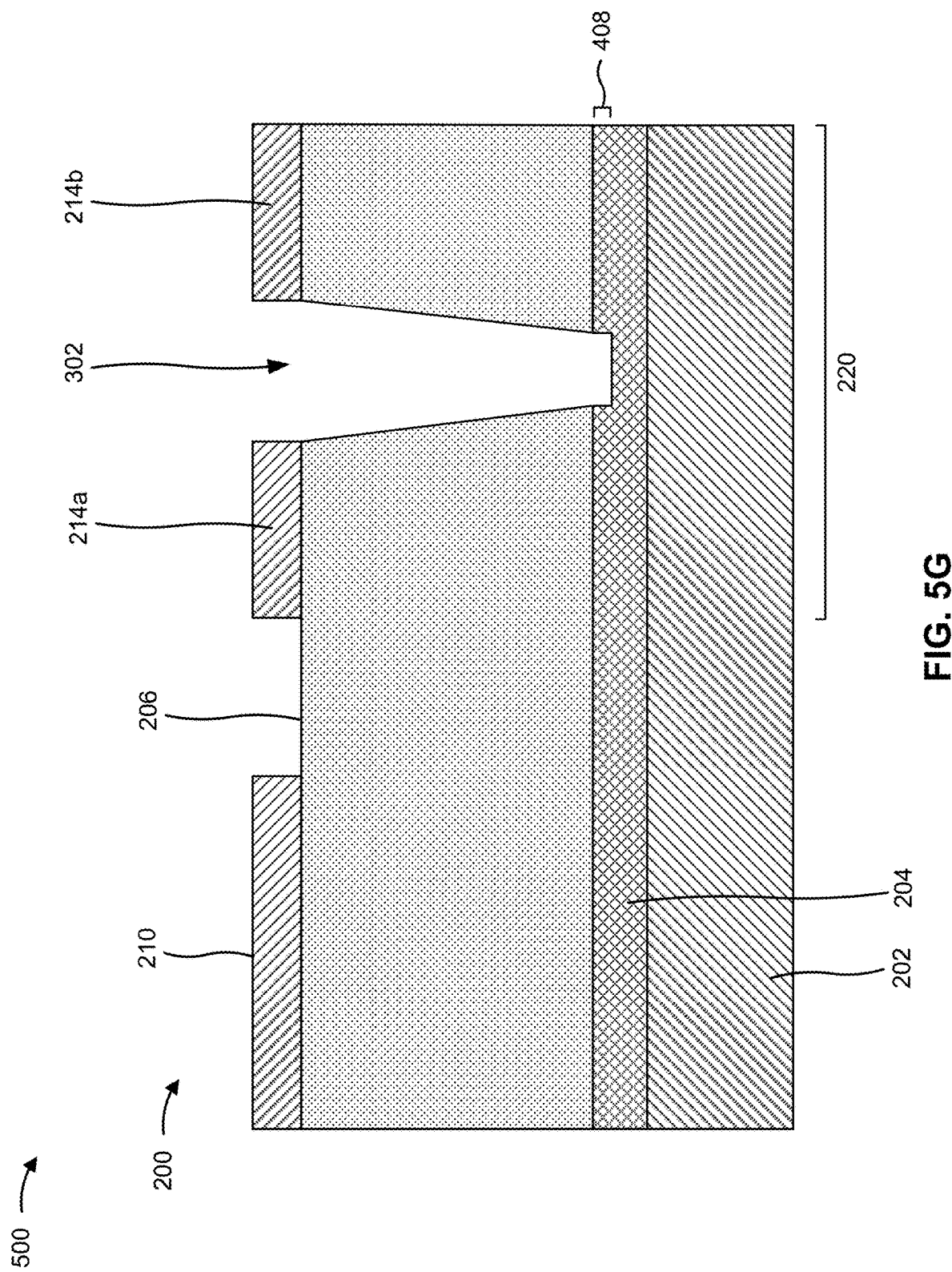

As shown in FIG. 5G, a deep trench structure 302 may be formed in and/or through the metallization layer 502, and in and/or through the dielectric layer 206. Moreover, the deep trench structure 302 may be formed at least partially in and/or at least partially through the dielectric layer 204 such that an over-etch region 408 is formed below the top surface of the dielectric layer 204. The deep trench structure 302 may be formed by coating the metallization layer 502 and/or the dielectric layer 206 with a photoresist (e.g., using the deposition tool 102), forming a pattern in the photoresist by exposing the photoresist to a radiation source (e.g., using the exposure tool 104), removing either the exposed portions or the non-exposed portions of the photoresist (e.g., using developer tool 106), and etching through the dielectric layer 206 and a portion of the dielectric layer 204 based on the pattern in the photoresist to form the deep trench structure 302 and the over-etch region 408. In some implementations, the deep trench structure 302 may be formed to a depth, a width, an aspect ratio, and/or a sidewall angle such that the deep trench structure 302 satisfies a capacitance value parameter for the capacitive device 200, such that the deep trench structure 302 satisfies a parasitic capacitance parameter for the capacitive device 200, such that a particular volume of dielectric material can be filled in the deep trench structure 302, and/or such that other operation parameters and/or performance parameters of the capacitive device 200 are achieved and/or satisfied.

Figure 5H:
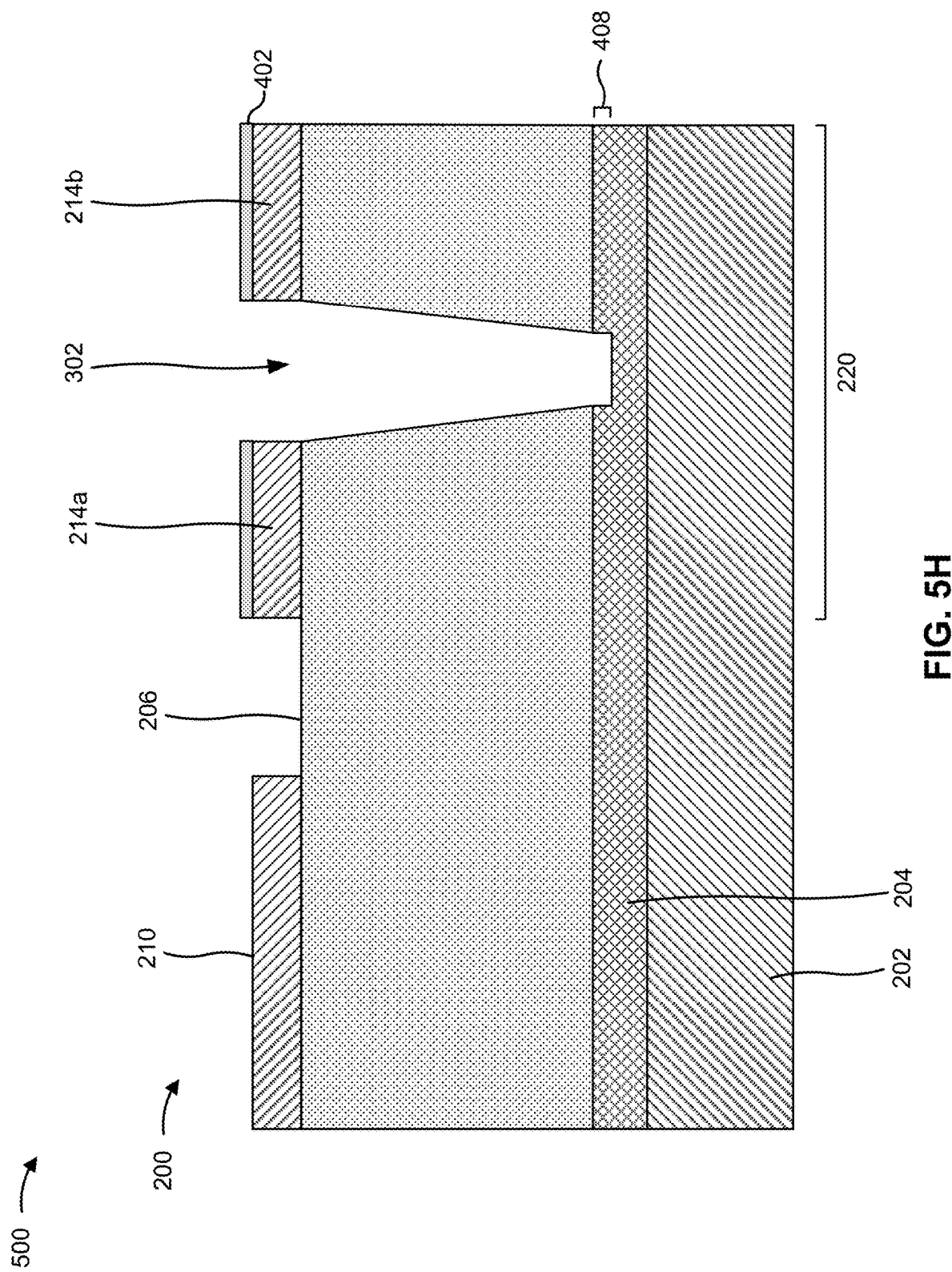

As shown in FIG. 5H, a passivation layer 402 (e.g., a circuit passivation layer) may be formed above and/or on the electrodes 214a and 214b. A semiconductor processing tool (e.g., the deposition tool 102) may deposit the passivation layer 402 using a CVD technique, a PVD technique, an ALD technique, or another type of deposition technique. In some implementations, the passivation layer 402 may be formed to a height (or thickness) to satisfy a circuit passivation parameter for the capacitive device 200.

Figure 5I:
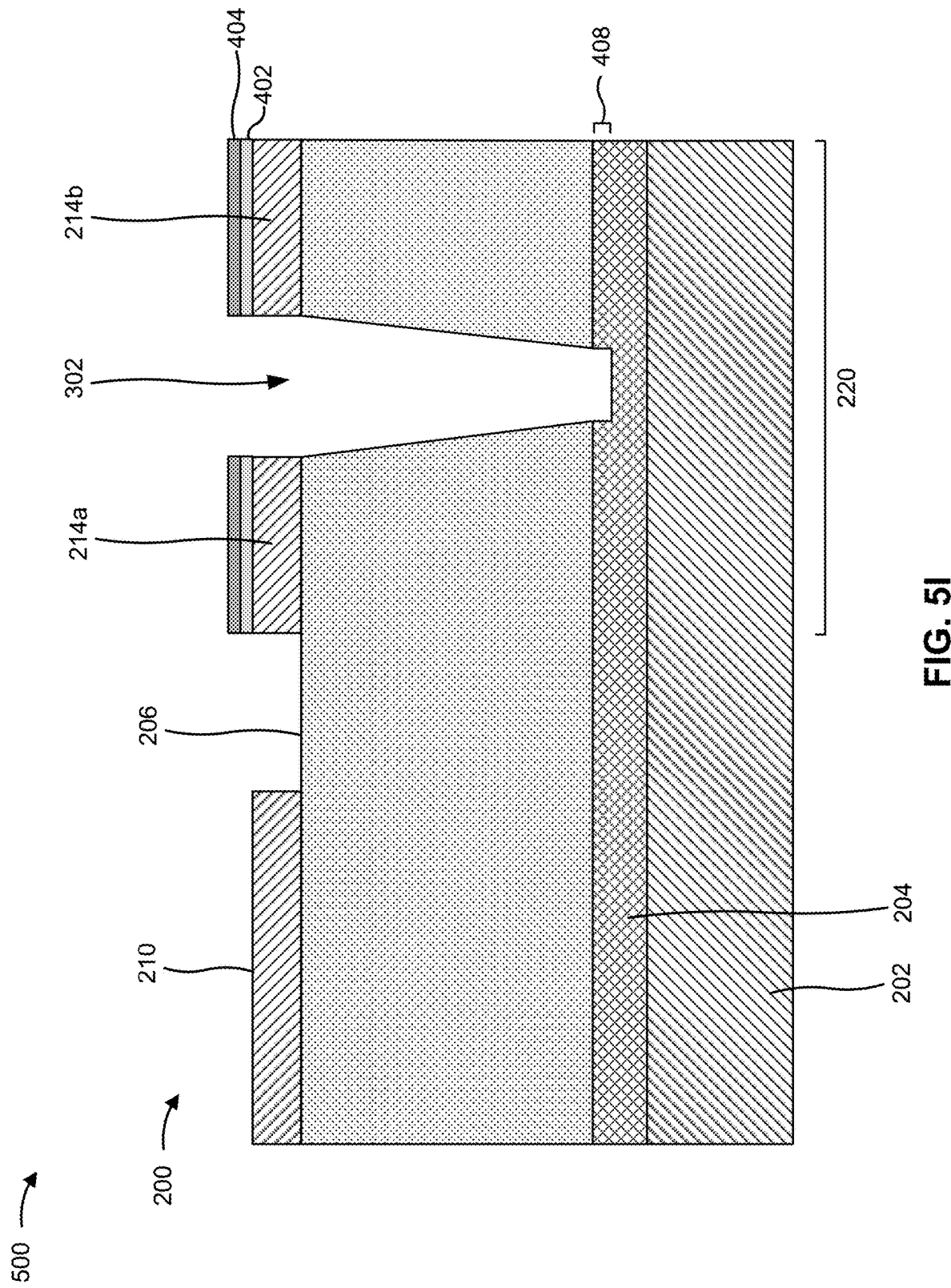

As shown in FIG. 5I, a passivation layer 404 (e.g., a circuit passivation layer) may be formed above and/or on the passivation layer 402. A semiconductor processing tool (e.g., the deposition tool 102) may deposit the passivation layer 404 using a CVD technique, a PVD technique, an ALD technique, or another type of deposition technique. In some implementations, the passivation layer 404 may be formed to a height (or thickness) to satisfy a circuit passivation parameter for the capacitive device 200.

Figure 5J:
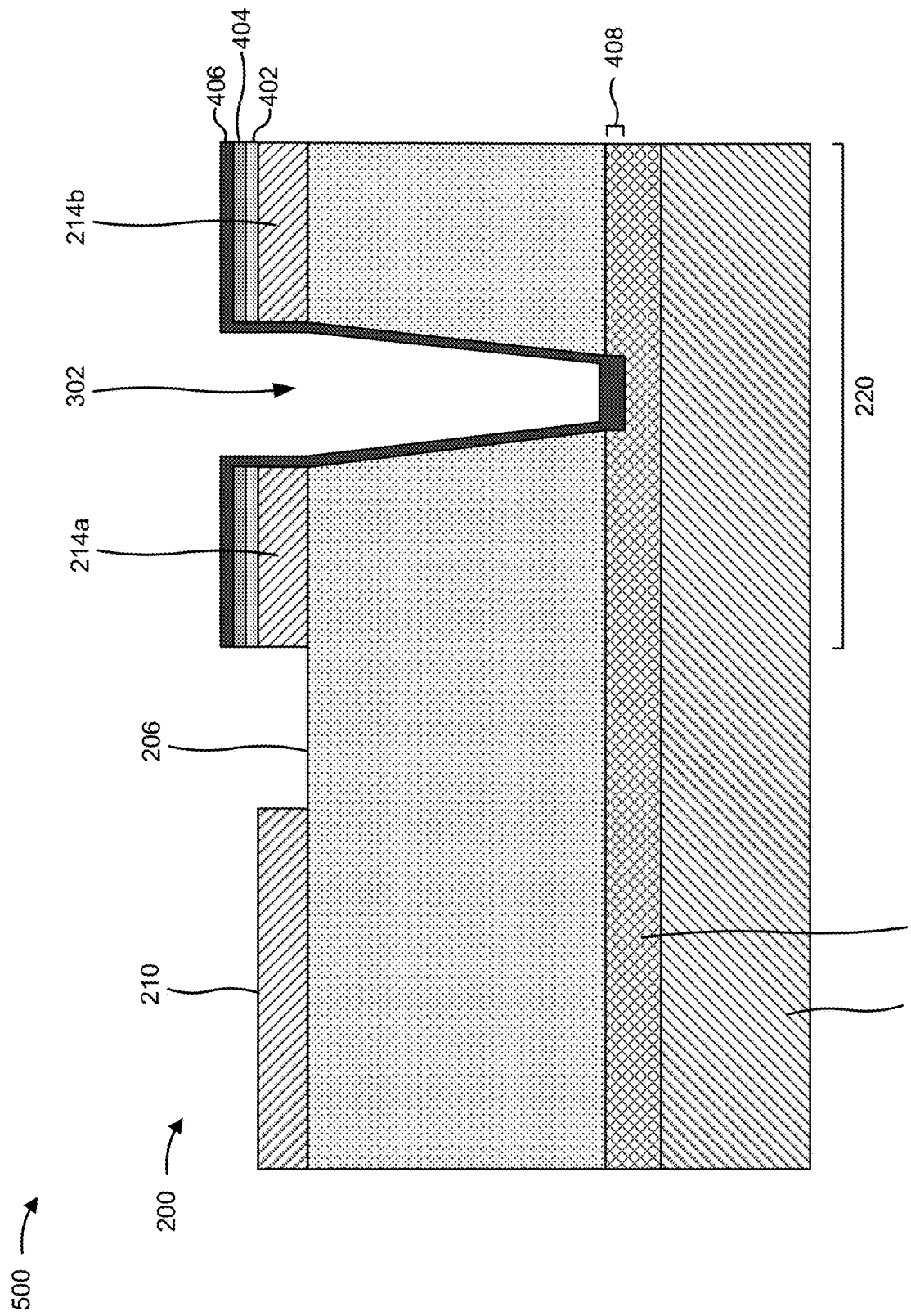

As shown in FIG. 5J, a passivation layer 406 (e.g., a trench passivation layer) may be formed above and/or on the passivation layer 404 and in the deep trench structure 302. In particular, the passivation layer 406 may be formed on the bottom of the deep trench structure 302 in the over-etch region 408 and on the sidewalls of the deep trench structure 302. A semiconductor processing tool (e.g., the deposition tool 102) may deposit the passivation layer 406 using a CVD technique, a PVD technique, an ALD technique, or another type of deposition technique. In some implementations, the passivation layer 406 may be formed to a height (or thickness) to satisfy a trench passivation parameter for the capacitive device 200.

Figure 5K:
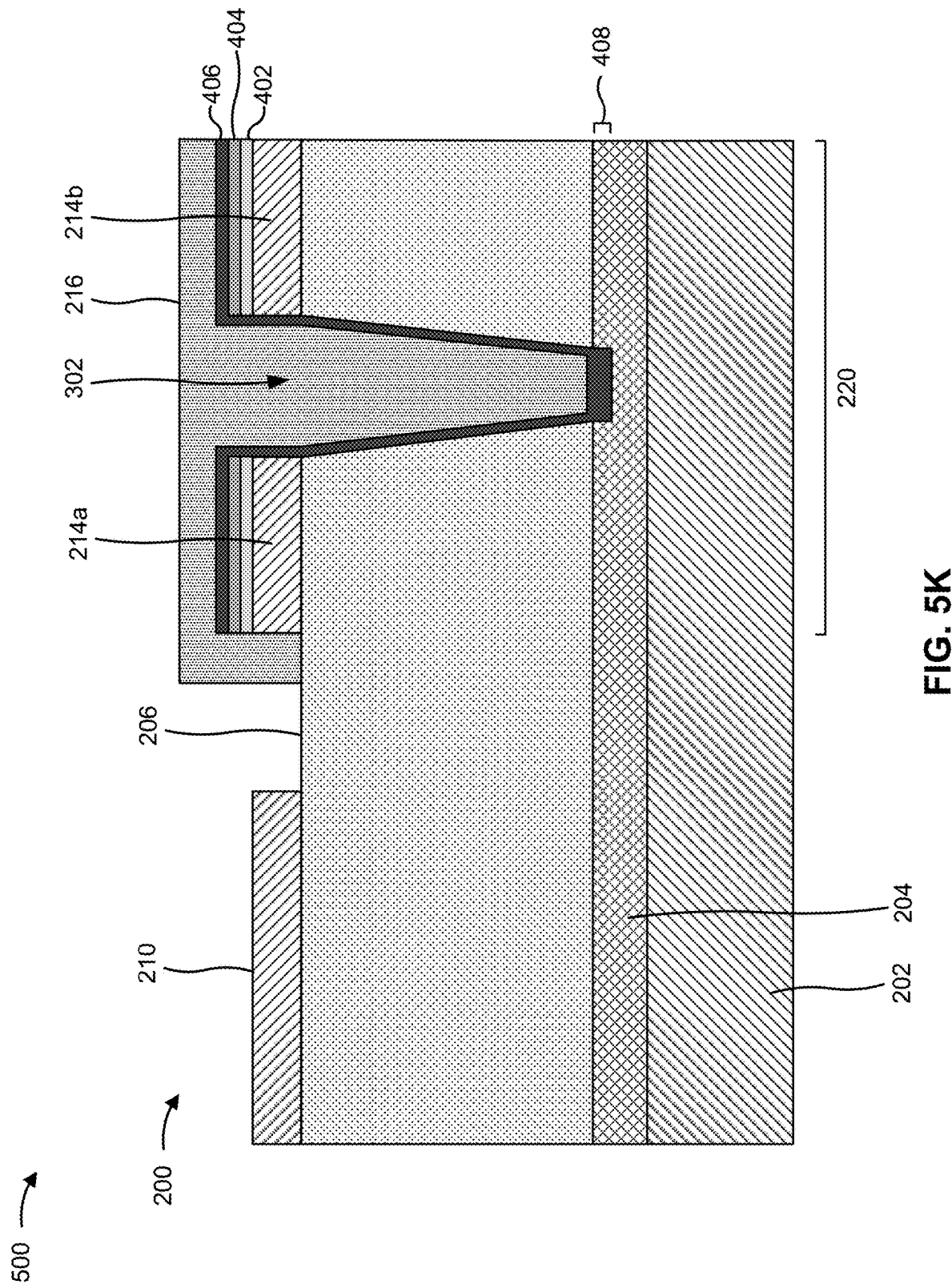

As shown in FIG. 5K, a dielectric layer 216 (e.g., a humidity sensing layer) may be formed above and/or on the passivation layer 406, above and/or on the electrodes 214a and 214b, and in the deep trench structure 302. A semiconductor processing tool (e.g., the deposition tool 102) may deposit the dielectric layer 216 using a CVD technique, a PVD technique, an ALD technique, or another type of deposition technique. In some implementations, the dielectric layer 216 may be formed to a height (or thickness) and/or of a particular dielectric material to satisfy a humidity sensing capability parameter for the capacitive device 200, to satisfy a capacitance value parameter for the capacitive device 200, to satisfy a parasitic capacitance parameter for the capacitive device 200, and/or to satisfy other operation parameters and/or performance parameters of the capacitive device 200.

As indicated above, FIGS. 5A-5K are provided as one or more examples. Other examples may differ from what is described with regard to FIGS. 5A-5K. In some implementations, the process of forming the capacitive device 200 may include additional techniques and/or procedures, fewer techniques and/or procedures, different techniques and/or procedures, or differently arranged techniques and/or procedures than those depicted in FIG. 5A-5K.

Figure 6:
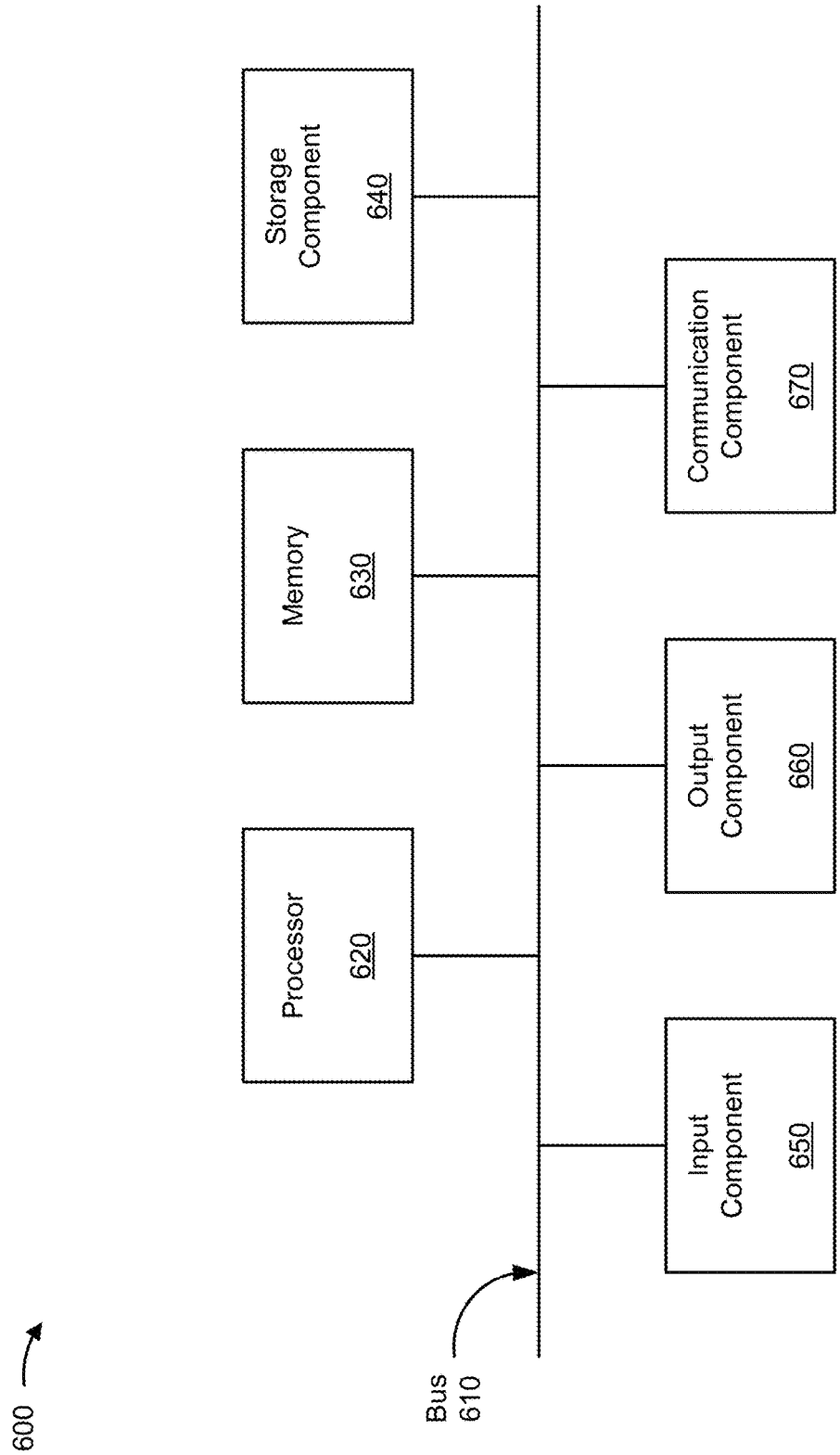
FIG. 6 is a diagram of example components of one or more devices of FIG. 1.

FIG. 6 is a diagram of example components of a device 600. In some implementations, one or more of the semiconductor processing tools 102-112 may include one or more devices 600 and/or one or more components of device 600. As shown in FIG. 6, device 600 may include a bus 610, a processor 620, a memory 630, a storage component 640, an input component 650, an output component 660, and a communication component 670.

Bus 610 includes a component that enables wired and/or wireless communication among the components of device 600. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform a function. Memory 630 includes a random access memory, a read only memory, and/or another type of memory (e.g., a flash memory, a magnetic memory, and/or an optical memory).

Storage component 640 stores information and/or software related to the operation of device 600. For example, storage component 640 may include a hard disk drive, a magnetic disk drive, an optical disk drive, a solid state disk drive, a compact disc, a digital versatile disc, and/or another type of non-transitory computer-readable medium. Input component 650 enables device 600 to receive input, such as user input and/or sensed inputs. For example, input component 650 may include a touch screen, a keyboard, a keypad, a mouse, a button, a microphone, a switch, a sensor, a global positioning system component, an accelerometer, a gyroscope, and/or an actuator. Output component 660 enables device 600 to provide output, such as via a display, a speaker, and/or one or more light-emitting diodes. Communication component 670 enables device 600 to communicate with other devices, such as via a wired connection and/or a wireless connection. For example, communication component 670 may include a receiver, a transmitter, a transceiver, a modem, a network interface card, and/or an antenna.

Device 600 may perform one or more processes described herein. For example, a non-transitory computer-readable medium (e.g., memory 630 and/or storage component 640) may store a set of instructions (e.g., one or more instructions, code, software code, and/or program code) for execution by processor 620. Processor 620 may execute the set of instructions to perform one or more processes described herein. In some implementations, execution of the set of instructions, by one or more processors 620, causes the one or more processors 620 and/or the device 600 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

FIG. 7 is a flowchart of an example process 700 associated with forming a capacitive device. In some implementations, one or more process blocks of FIG. 7 may be performed by one or more semiconductor processing tools (e.g., one or more of the semiconductor processing tools 102-112). Additionally, or alternatively, one or more process blocks of FIG. 7 may be performed by one or more components of device 600, such as processor 620, memory 630, storage component 640, input component 650, output component 660, and/or communication component 670.

As shown in FIG. 7, process 700 may include forming a first dielectric layer on a substrate of a capacitive device (block 710). For example, a semiconductor processing tool (e.g., the deposition tool 102) may form a first dielectric layer 204 on a substrate 202 of a capacitive device 200, as described above.

As further shown in FIG. 7, process 700 may include forming a second dielectric layer on the first dielectric layer (block 720). For example, a semiconductor processing tool (e.g., the deposition tool 102) may form a second dielectric layer 206 on the first dielectric layer 204, as described above.

As further shown in FIG. 7, process 700 may include forming a metal layer on the second dielectric layer (block 730). For example, a semiconductor processing tool (e.g., the deposition tool 102, the plating tool 110, and/or another semiconductor processing tool) may form a metal layer 502 on the second dielectric layer 206, as described above.

As further shown in FIG. 7, process 700 may include etching the metal layer to form a first electrode of the capacitive device, a first electrode pad, associated with the first electrode, of the capacitive device, a second electrode of the capacitive device, and a second electrode pad, associated with the second electrode, of the capacitive device (block 740). For example, one or more semiconductor processing tools (e.g., the deposition tool 102, the exposure tool 104, the developer tool 106, the etching tool 108, and/or another semiconductor processing tool) may etch the metal layer 502 to form a first electrode 214a of the capacitive device 200, a first electrode pad 210 associated with the first electrode 214a of the capacitive device 200, a second electrode 214b of the capacitive device 200, and a second electrode pad 210 associated with the second electrode 214b of the capacitive device 200, as described above.

As further shown in FIG. 7, process 700 may include etching through the second dielectric layer and into a portion of the first dielectric layer to form a deep trench structure between the first electrode and the second electrode (block 750). For example, one or more semiconductor processing tools (e.g., the deposition tool 102, the exposure tool 104, the developer tool 106, the etching tool 108, and/or another semiconductor processing tool) may etch through the second dielectric layer 206 and into a portion 408 of the first dielectric layer 204 to form a deep trench structure 302 between the first electrode 214a and the second electrode 214b, as described above.

As further shown in FIG. 7, process 700 may include forming a humidity sensing layer in the deep trench structure (block 760). For example, the semiconductor processing tool (e.g., the deposition tool 102) may form a humidity sensing layer 216 in the deep trench structure 302, as described above.

Process 700 may include additional implementations, such as any single implementation or any combination of implementations described below and/or in connection with one or more other processes described elsewhere herein.

In a first implementation, process 700 includes forming (e.g., using the deposition tool 102) a first electrical passivation layer 402 on the first electrode 214a and on the second electrode 214b, forming (e.g., using the deposition tool 102) a second electrical passivation layer 404 on the first electrical passivation layer 402, and forming (e.g., using the deposition tool 102) a trench passivation layer 406 on the second electrical passivation layer 404 and in the deep trench structure 302. In a second implementation, alone or in combination with the first implementation, forming the humidity sensing layer 216 in the deep trench structure 302 includes forming the humidity sensing layer 216 over the trench passivation layer 406 in the deep trench structure 302.

In a third implementation, alone or in combination with one or more of the first and second implementations, etching through the second dielectric layer 206 and into the portion of the first dielectric layer 204 to form the deep trench structure 302 includes etching through the second dielectric layer 206 and into the portion 408 of the first dielectric layer 204 to form the deep trench structure 302 to a particular height such that the capacitive device 200 satisfies at least one of a capacitance value parameter or a parasitic capacitance parameter. In a fourth implementation, alone or in combination with one or more of the first through third implementations, etching through the second dielectric layer 206 and into the portion 408 of the first dielectric layer 204 to form the deep trench structure 302 includes etching through the second dielectric layer 206 and into the portion 408 of the first dielectric layer 204 to form the deep trench structure 302 to a particular width such that the capacitive device 200 satisfies at least one of a capacitance value parameter or a parasitic capacitance parameter.

In a fifth implementation, alone or in combination with one or more of the first through fourth implementations, etching through the second dielectric layer 206 and into the portion 408 of the first dielectric layer 204 to form the deep trench structure 302 includes etching through the second dielectric layer 206 and into the portion of the first dielectric layer 204 to form the deep trench structure 302 to a particular aspect ratio such that the capacitive device 200 satisfies at least one of a capacitance value parameter or a parasitic capacitance parameter. In a sixth implementation, alone or in combination with one or more of the first through fifth implementations, etching through the second dielectric layer 206 and into the portion 408 of the first dielectric layer 204 to form the deep trench structure 302 includes etching through the second dielectric layer 206 and into the portion 408 of the first dielectric layer 204 to form the deep trench structure 302 to a particular volume such that the capacitive device 200 satisfies at least one of a capacitance value parameter or a parasitic capacitance parameter.

In a seventh implementation, alone or in combination with one or more of the first through sixth implementations, etching the metal layer 502 to form the first electrode 214a and the second electrode 214b includes etching the metal layer 502 to form the first electrode 214a and the second electrode 214b to respective widths such that the capacitive device 200 satisfies a capacitance parameter. In an eighth implementation, alone or in combination with one or more of the first through seventh implementations, forming the second dielectric layer 206 on the first dielectric layer 204 includes forming the second dielectric layer 206 directly on the first dielectric layer 204 without an intervening metallization layer.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

In this way, one or more metal etch-stop layers may be omitted from the capacitive device such that the deep trench structure may be formed between electrodes of the capacitive device down to (and partially in) an ILD layer of the capacitive device. In this way, the deep trench structure may be formed to a depth and/or an aspect ratio that increases the volume of the deep trench structure relative to a trench structure formed using a metal etch-stop layer. Thus, the deep trench structure is capable of being filled with a greater amount of dielectric material, which increases the capacitance value of the capacitive device. Moreover, the parasitic capacitance of the capacitive device may be decreased by omitting the metal etch-stop layer. Accordingly, the deep trench structure (and the omission of the metal etch-stop layer) may increase the sensitivity of the capacitive device, may increase the humidity-sensing performance of the capacitive device, and/or may increase the performance of devices (e.g., MEMS devices and/or other types of semiconductor devices) and/or integrated circuits in which the capacitive device is included.

As described in greater detail above, some implementations described herein provide a capacitive device. The capacitive device includes a first electrode and a second electrode. The capacitive device includes a deep trench structure between the first electrode and the second electrode. A bottom of the deep trench structure is in an over-etch region that is below a surface of an ILD layer. The ILD layer is below the first electrode and the second electrode. The capacitive device includes a dielectric layer in the deep trench structure.

As described in greater detail above, some implementations described herein provide a capacitive device. The capacitive device includes a positive charge electrode structure including a plurality of positive electrodes connected to a first electrode pad. The capacitive device includes a negative charge electrode structure including a plurality of negative electrodes connected to a second electrode pad. The capacitive device includes a plurality of deep trench structures. A deep trench structure, of the plurality of deep trench structures, is located between a pair of a positive electrode of the plurality of positive electrodes and a negative electrode of the plurality of negative electrodes. An aspect ratio, between a width of the deep trench structure and a height of the deep trench structure, is in a range of approximately 0.26 to approximately 0.38. The capacitive device includes a humidity sensing layer in the plurality of deep trench structures.

As described in greater detail above, some implementations described herein provide a method. The method includes forming a first dielectric layer on a substrate of a capacitive device. The method includes forming a second dielectric layer on the first dielectric layer. The method includes forming a metal layer on the second dielectric layer. The method includes etching the metal layer to form a first electrode of the capacitive device, a first electrode pad, associated with the first electrode, of the capacitive device, a second electrode of the capacitive device, and a second electrode pad, associated with the second electrode, of the capacitive device. The method includes etching through the second dielectric layer and into a portion of the first dielectric layer to form a deep trench structure between the first electrode and the second electrode. The method includes forming a humidity sensing layer in the deep trench structure. The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A capacitive device, comprising:
    a first electrode;
    a second electrode;
    a third electrode;
    a first deep trench structure between the first electrode and the second electrode,
        wherein a bottom of the first deep trench structure is in a first over-etch region that is below a surface of an interlayer dielectric (ILD) layer, and
        wherein the ILD layer is below the first electrode, the second electrode, and the third electrode;
    a second deep trench structure between the second electrode and the third electrode,
    wherein a bottom of the second deep trench structure is in a second over-etch region that is below the surface of the ILD layer; and
    a dielectric layer in the first deep trench structure and the second deep trench structure.

2. The capacitive device of claim 1, wherein a depth of the first over-etch region, relative to the surface of the ILD layer, is in a range of approximately 1,000 angstroms to approximately 9,000 angstroms.

3. The capacitive device of claim 1, wherein a depth of the first deep trench structure is in a range of approximately 42,000 angstroms to approximately 50,000 angstroms.

4. The capacitive device of claim 1, wherein a width of the first deep trench structure is greater than approximately 15,000 angstroms.

5. The capacitive device of claim 1, wherein an aspect ratio, between a width of the first deep trench structure and a height of the first deep trench structure, is in a range of approximately 0.26 to approximately 0.38.

6. The capacitive device of claim 1, wherein a sidewall angle of the first deep trench structure is in a range of approximately 7 degrees to approximately 8 degrees.

7. The capacitive device of claim 1, wherein the dielectric layer comprises a polyimide layer.

8. A capacitive device, comprising:
    a positive charge electrode structure comprising a plurality of positive electrodes connected to a first electrode pad;
    a negative charge electrode structure comprising a plurality of negative electrodes connected to a second electrode pad;
    a plurality of deep trench structures,
        wherein a first deep trench structure, of the plurality of deep trench structures, is located between a first positive electrode of the plurality of positive electrodes and a negative electrode of the plurality of negative electrodes,
        wherein an aspect ratio, between a width of the first deep trench structure and a height of the first deep trench structure, is in a range of approximately 0.26 to approximately 0.38,
    wherein a second deep trench structure, of the plurality of deep trench structures, is located between a second positive electrode of the plurality of positive electrodes and the negative electrode, and
    wherein an aspect ratio, between a width of the second deep trench structure and a height of the second deep trench structure, is in the range; and
    a humidity sensing layer in the plurality of deep trench structures.

9. The capacitive device of claim 8, wherein the plurality of positive electrodes and the plurality of negative electrodes are interdigitated.

10. The capacitive device of claim 8, wherein the plurality of deep trench structures are formed through a portion of an interlayer dielectric (ILD) layer of the capacitive device and through an intermetal dielectric (IMD) layer of the capacitive device on the ILD layer.

11. The capacitive device of claim 10, wherein the IMD layer is directly on the ILD layer without an intervening metallization layer.

12. A method, comprising:
forming a first dielectric layer on a substrate of a capacitive device;
forming a second dielectric layer on the first dielectric layer;
forming a metal layer on the second dielectric layer;
etching the metal layer to form:
a first electrode of the capacitive device,
a first electrode pad, associated with the first electrode, of the capacitive device,
a second electrode of the capacitive device,
a second electrode pad, associated with the second electrode, of the capacitive device, and
a third electrode of the capacitive device;
etching through the second dielectric layer and partially into the first dielectric layer to form a plurality of deep trench structures that are partially in the first dielectric layer,
wherein a first deep trench structure, of the plurality of deep trench structures, is formed between the first electrode and the second electrode, and
wherein a second deep trench structure, of the plurality of deep trench structures, is formed between the second electrode and the third electrode; and
forming a humidity sensing layer in the plurality of deep trench structures.

13. The method of claim 12, further comprising:
forming a first electrical passivation layer on the first electrode and on the second electrode;
forming a second electrical passivation layer on the first electrical passivation layer; and
forming a trench passivation layer on the second electrical passivation layer and in the first deep trench structure.

14. The method of claim 13, wherein forming the humidity sensing layer in the plurality of deep trench structures comprises:
forming the humidity sensing layer over the trench passivation layer in the first deep trench structure.

15. The method of claim 12, wherein etching through the second dielectric layer and partially into the first dielectric layer to form the plurality of deep trench structures comprises:
etching through the second dielectric layer and partially into the first dielectric layer to form the first deep trench structure to a particular height such that the capacitive device satisfies at least one of a capacitance value parameter or a parasitic capacitance parameter.

16. The method of claim 12, wherein etching through the second dielectric layer and partially into the first dielectric layer to form the plurality of deep trench structures comprises:
etching through the second dielectric layer and partially into the first dielectric layer to form the first deep trench structure to a particular width such that the capacitive device satisfies at least one of a capacitance value parameter or a parasitic capacitance parameter.

17. The method of claim 12, wherein etching through the second dielectric layer and partially into the first dielectric layer to form the plurality of deep trench structures comprises:
etching through the second dielectric layer and partially into the first dielectric layer to form the first deep trench structure to a particular aspect ratio such that the capacitive device satisfies at least one of a capacitance value parameter or a parasitic capacitance parameter.

18. The method of claim 12, wherein etching through the second dielectric layer and partially into the first dielectric layer to form the plurality of deep trench structures comprises:
etching through the second dielectric layer and partially into the first dielectric layer to form the first deep trench structure to a particular volume such that the capacitive device satisfies at least one of a capacitance value parameter or a parasitic capacitance parameter.

19. The method of claim 12, wherein etching the metal layer to form the first electrode and the second electrode comprises:
etching the metal layer to form the first electrode and the second electrode to respective widths such that the capacitive device satisfies a capacitance parameter.

20. The method of claim 12, wherein forming the second dielectric layer on the first dielectric layer comprises:
forming the second dielectric layer directly on the first dielectric layer without an intervening metallization layer.

* * * * *